United States Patent
Li et al.

(10) Patent No.: US 10,870,772 B2
(45) Date of Patent: Dec. 22, 2020

(54) TRANSPARENT CONDUCTIVE FILMS WITH FUSED NETWORKS

(71) Applicant: C3Nano Inc., Hayward, CA (US)

(72) Inventors: Ying-Syi Li, Fremont, CA (US); Xiqiang Yang, Hayward, CA (US); Yu Kambe, Chicago, IL (US); Xiaofeng Chen, San Jose, CA (US); Hua Gu, Dublin, CA (US); Steven Michael Lam, San Jose, CA (US); Melanie Maniko Inouye, Fremont, CA (US); Arthur Yung-Chi Cheng, Fremont, CA (US); Alex Da Zhang Tan, Singapore (SG); Christopher Steven Scully, Campbell, CA (US); Ajay Virkar, San Mateo, CA (US)

(73) Assignee: C3Nano Inc., Hayward, CA (US)

( * ) Notice: Subject to any disclaimer, the term of this patent is extended or adjusted under 35 U.S.C. 154(b) by 81 days.

(21) Appl. No.: 16/127,462

(22) Filed: Sep. 11, 2018

(65) Prior Publication Data

US 2019/0010347 A1    Jan. 10, 2019

Related U.S. Application Data

(63) Continuation of application No. 15/247,533, filed on Aug. 25, 2016, now Pat. No. 10,100,213, which is a
(Continued)

(51) Int. Cl.
*C09D 11/52*  (2014.01)
*H05K 1/02*  (2006.01)
(Continued)

(52) U.S. Cl.
CPC .............. *C09D 11/52* (2013.01); *B05D 1/005* (2013.01); *B05D 1/02* (2013.01); *B05D 1/18* (2013.01);
(Continued)

(58) Field of Classification Search
CPC ......... C09D 11/52; C09D 11/08; C09D 11/10; C09D 11/14; C09D 11/102; C09D 11/106;
(Continued)

(56) References Cited

U.S. PATENT DOCUMENTS 6,741,019 B1    5/2004    Filas et al.
7,218,004 B2    5/2007    Pan et al.
(Continued)

FOREIGN PATENT DOCUMENTS

CN    1399317 A    2/2003
CN    101128550 A    2/2008
(Continued)

OTHER PUBLICATIONS

Bi et al., "In situ Oxidation synthesis of AG/AGCl core-shell nanowires and their photocatalytic properties," Chem. Commun. (2009), pp. 6551-6553.
(Continued)

*Primary Examiner* — Michael Bernshteyn
(74) *Attorney, Agent, or Firm* — Christensen, Fonder, Dardi & Herbert PLLC; Peter S. Dardi

(57) ABSTRACT

Fusing nanowire inks are described that can also comprise a hydrophilic polymer binder, such as a cellulose based binder. The fusing nanowire inks can be deposited onto a substrate surface and dried to drive the fusing process. Transparent conductive films can be formed with desirable properties.

20 Claims, 4 Drawing Sheets

Related U.S. Application Data continuation of application No. 14/848,697, filed on Sep. 9, 2015, now Pat. No. 9,447,301, which is a continuation of application No. 14/464,332, filed on Aug. 20, 2014, now Pat. No. 9,150,746, which is a continuation of application No. 14/448,504, filed on Jul. 31, 2014, now Pat. No. 9,183,968.

(51) Int. Cl.

| | | |
|---|---|---|
| H05K 1/09 | (2006.01) | |
| H01B 1/22 | (2006.01) | |
| C09D 101/02 | (2006.01) | |
| C09D 139/06 | (2006.01) | |
| B05D 3/02 | (2006.01) | |
| B05D 5/06 | (2006.01) | |
| H01B 13/30 | (2006.01) | |
| C09D 11/08 | (2006.01) | |
| C09D 11/10 | (2014.01) | |
| C09D 11/14 | (2006.01) | |
| H01B 1/02 | (2006.01) | |
| B65D 1/00 | (2006.01) | |
| B65D 1/02 | (2006.01) | |
| B65D 1/18 | (2006.01) | |
| B65D 1/28 | (2006.01) | |
| C09D 11/102 | (2014.01) | |
| C09D 11/106 | (2014.01) | |
| C23C 30/00 | (2006.01) | |
| B05D 1/00 | (2006.01) | |
| B05D 1/02 | (2006.01) | |
| B05D 1/18 | (2006.01) | |
| B05D 1/26 | (2006.01) | |
| B05D 1/28 | (2006.01) | |
| G06F 3/044 | (2006.01) | |
| G06F 3/045 | (2006.01) | |

(52) U.S. Cl.
CPC ............. *B05D 1/265* (2013.01); *B05D 1/28* (2013.01); *B05D 3/0254* (2013.01); *B05D 5/06* (2013.01); *C09D 11/08* (2013.01); *C09D 11/10* (2013.01); *C09D 11/102* (2013.01); *C09D 11/106* (2013.01); *C09D 11/14* (2013.01); *C09D 101/02* (2013.01); *C09D 139/06* (2013.01); *C23C 30/00* (2013.01); *H01B 1/02* (2013.01); *H01B 1/22* (2013.01); *H01B 13/30* (2013.01); *H05K 1/0274* (2013.01); *H05K 1/097* (2013.01); *G06F 3/044* (2013.01); *G06F 3/045* (2013.01); *G06F 2203/04103* (2013.01); *H05K 2201/0108* (2013.01); *H05K 2201/026* (2013.01); *H05K 2201/10128* (2013.01); *H05K 2201/10151* (2013.01)

(58) Field of Classification Search
CPC .. C09D 101/02; C09D 139/06; H05K 1/0274; H05K 1/097; B05D 3/0254; B05D 5/06; B05D 1/005; B05D 1/02; B05D 1/18; B05D 1/265; B05D 1/28; H01B 1/22; H01B 1/02; H01B 13/30
USPC ...................................... 428/411.1
See application file for complete search history.

(56) References Cited

U.S. PATENT DOCUMENTS

| | | |
|---|---|---|
| 7,849,424 B2 | 12/2010 | Wolk et al. |
| 7,902,639 B2 | 3/2011 | Garrou et al. |
| 7,922,787 B2 | 4/2011 | Wang et al. |
| 8,018,563 B2 | 9/2011 | Jones et al. |
| 8,018,568 B2 | 9/2011 | Allemand et al. |
| 8,031,180 B2 | 10/2011 | Miyamoto et al. |
| 8,049,333 B2 | 11/2011 | Alden et al. |
| 8,052,773 B2 | 11/2011 | Takada |
| 8,094,247 B2 | 1/2012 | Allemand et al. |
| 8,174,667 B2 | 5/2012 | Allemand et al. |
| 8,198,796 B2 | 6/2012 | Takada |
| 9,150,746 B1 | 10/2015 | Li et al. |
| 9,183,968 B1 | 11/2015 | Li et al. |
| 9,396,843 B2 | 7/2016 | Chung et al. |
| 9,447,301 B2 | 9/2016 | Li et al. |
| 9,603,242 B2* | 3/2017 | Pellerite ............... B23K 26/361 |
| 10,026,518 B2 | 6/2018 | Sepa et al. |
| 10,020,807 B2 | 7/2018 | Virkar et al. |
| 10,100,213 B2 | 10/2018 | Li et al. |
| 2003/0022518 A1 | 1/2003 | Munakata et al. |
| 2005/0074589 A1 | 4/2005 | Pan et al. |
| 2005/0196707 A1 | 9/2005 | Cok |
| 2005/0214480 A1 | 9/2005 | Garbar et al. |
| 2005/0215689 A1 | 9/2005 | Garbar et al. |
| 2006/0052947 A1 | 3/2006 | Hu |
| 2006/0083694 A1 | 4/2006 | Kodas et al. |
| 2006/0163744 A1 | 7/2006 | Vanheusden et al. |
| 2006/0205240 A1 | 9/2006 | Pan et al. |
| 2006/0286785 A1 | 12/2006 | Rogers et al. |
| 2007/0074316 A1 | 3/2007 | Alden et al. |
| 2008/0003130 A1 | 1/2008 | Xia et al. |
| 2008/0034921 A1 | 2/2008 | Vanheusden et al. |
| 2008/0050513 A1 | 2/2008 | Wang et al. |
| 2008/0143906 A1 | 6/2008 | Allemand et al. |
| 2008/0147019 A1 | 6/2008 | Song et al. |
| 2008/0210052 A1 | 9/2008 | Allemand |
| 2008/0213663 A1 | 9/2008 | Hu et al. |
| 2008/0259262 A1 | 10/2008 | Jones et al. |
| 2008/0283799 A1 | 11/2008 | Alden et al. |
| 2008/0286447 A1 | 11/2008 | Alden et al. |
| 2008/0286488 A1 | 11/2008 | Li et al. |
| 2008/0292979 A1 | 11/2008 | Ding et al. |
| 2008/0317982 A1 | 12/2008 | Hecht et al. |
| 2009/0011147 A1 | 1/2009 | Dictus |
| 2009/0052029 A1 | 2/2009 | Dai et al. |
| 2009/0088326 A1 | 4/2009 | Baecker |
| 2009/0098405 A1 | 4/2009 | Matsunami |
| 2009/0129004 A1 | 5/2009 | Gruner |
| 2009/0130433 A1 | 5/2009 | Takada |
| 2009/0166055 A1 | 7/2009 | Guiheen et al. |
| 2009/0196788 A1 | 8/2009 | Wang et al. |
| 2009/0223703 A1 | 9/2009 | Winoto |
| 2009/0242231 A1 | 10/2009 | Miyagisima et al. |
| 2009/0283304 A1 | 11/2009 | Winoto |
| 2009/0301769 A1 | 12/2009 | Seppa et al. |
| 2009/0305437 A1 | 12/2009 | Allemand et al. |
| 2009/0311530 A1 | 12/2009 | Hirai et al. |
| 2009/0317435 A1 | 12/2009 | Vandesteeg et al. |
| 2009/0321113 A1 | 12/2009 | Allemand et al. |
| 2009/0321364 A1 | 12/2009 | Spaid et al. |
| 2010/0078197 A1 | 4/2010 | Miyagishima et al. |
| 2010/0078602 A1 | 4/2010 | Hosoya et al. |
| 2010/0140564 A1 | 6/2010 | Overbeek et al. |
| 2010/0197068 A1 | 8/2010 | Poon et al. |
| 2010/0243295 A1 | 9/2010 | Allemand et al. |
| 2010/0307792 A1 | 12/2010 | Allemand et al. |
| 2011/0024159 A1 | 2/2011 | Allemand et al. |
| 2011/0042126 A1 | 2/2011 | Spaid et al. |
| 2011/0045272 A1 | 2/2011 | Allemand |
| 2011/0048170 A1 | 3/2011 | Bhatia et al. |
| 2011/0062389 A1 | 3/2011 | Wang et al. |
| 2011/0088770 A1* | 4/2011 | Allemand ............... H05K 3/245 |
| | | 136/256 |
| 2011/0094651 A1 | 4/2011 | Kuriki |
| 2011/0095275 A1 | 4/2011 | Li et al. |
| 2011/0120749 A1 | 5/2011 | Yeo et al. |
| 2011/0151211 A1 | 6/2011 | Chang et al. |
| 2011/0162870 A1 | 7/2011 | Markovich et al. |
| 2011/0163403 A1 | 7/2011 | Bhatia et al. |
| 2011/0174190 A1 | 7/2011 | Sepa et al. |
| 2011/0192633 A1 | 8/2011 | Allemand |
| 2011/0253668 A1 | 10/2011 | Winoto et al. |

(56) References Cited

U.S. PATENT DOCUMENTS

| | | |
|---|---|---|
| 2011/0281070 A1 | 11/2011 | Mittal et al. |
| 2011/0285019 A1 | 11/2011 | Alden et al. |
| 2011/0297642 A1 | 12/2011 | Allemand et al. |
| 2012/0033367 A1 | 2/2012 | Jones et al. |
| 2012/0034129 A1 | 2/2012 | Suh et al. |
| 2012/0073947 A1 | 3/2012 | Sakata et al. |
| 2012/0097059 A1 | 4/2012 | Allemand et al. |
| 2012/0103660 A1 | 5/2012 | Gupta et al. |
| 2012/0104374 A1 | 5/2012 | Allemand |
| 2012/0107598 A1 | 5/2012 | Zou et al. |
| 2012/0127097 A1 | 5/2012 | Gaynor et al. |
| 2012/0127113 A1 | 5/2012 | Yau et al. |
| 2012/0132930 A1 | 5/2012 | Young et al. |
| 2012/0138913 A1 | 6/2012 | Alsayed et al. |
| 2012/0152135 A1 | 6/2012 | Stebbins et al. |
| 2012/0168684 A1 | 7/2012 | Magadassi et al. |
| 2012/0183768 A1 | 7/2012 | Kondo et al. |
| 2012/0217453 A1 | 8/2012 | Lowenthal et al. |
| 2012/0223358 A1 | 9/2012 | Pschenitzka |
| 2012/0249453 A1 | 10/2012 | Tsukamoto |
| 2013/0000952 A1 | 1/2013 | Srinivas et al. |
| 2013/0001478 A1* | 1/2013 | Allemand ............ C09D 11/52 252/514 |
| 2013/0056244 A1 | 3/2013 | Srinivas et al. |
| 2013/0071557 A1 | 3/2013 | Haymov et al. |
| 2013/0146335 A1 | 6/2013 | Gambino et al. |
| 2013/0153829 A1 | 6/2013 | Kondo et al. |
| 2013/0189502 A1 | 7/2013 | Takahashi et al. |
| 2013/0266795 A1 | 10/2013 | Schultz et al. |
| 2013/0291683 A1 | 11/2013 | Sepa et al. |
| 2013/0341074 A1 | 12/2013 | Virkar et al. |
| 2013/0342221 A1 | 12/2013 | Virkar et al. |
| 2014/0004371 A1 | 1/2014 | Chung et al. |
| 2014/0054515 A1* | 2/2014 | Lowenthal ............ C09D 11/52 252/513 |
| 2014/0099486 A1 | 4/2014 | Ollmann et al. |
| 2014/0238833 A1* | 8/2014 | Virkar ............ B32B 15/08 200/600 |
| 2014/0255707 A1 | 9/2014 | Philip, Jr. et al. |
| 2014/0262454 A1 | 9/2014 | Zou et al. |
| 2014/0374146 A1 | 12/2014 | Saito et al. |
| 2015/0017457 A1 | 1/2015 | Mizuno et al. |
| 2015/0036276 A1 | 2/2015 | Kaneko et al. |
| 2015/0144380 A1* | 5/2015 | Yang ............ H05K 3/105 174/253 |
| 2015/0206623 A1 | 7/2015 | Poon |
| 2015/0208498 A1 | 7/2015 | Poon |
| 2015/0321257 A1 | 11/2015 | Suh et al. |
| 2016/0096967 A1 | 4/2016 | Virkar et al. |
| 2016/0108256 A1 | 4/2016 | Yang et al. |
| 2016/0122562 A1 | 5/2016 | Yang et al. |
| 2017/0015857 A1 | 1/2017 | Kodama et al. |

FOREIGN PATENT DOCUMENTS

| | | |
|---|---|---|
| CN | 101522947 A | 9/2009 |
| CN | 101589473 A | 11/2009 |
| CN | 102131602 A | 7/2011 |
| CN | 102193697 A | 9/2011 |
| CN | 102250506 A | 11/2011 |
| CN | 102544223 A | 7/2012 |
| CN | 102686777 A | 9/2012 |
| CN | 102763171 A | 10/2012 |
| CN | 102819338 A | 12/2012 |
| CN | 102819341 A | 12/2012 |
| CN | 102834472 A | 12/2012 |
| CN | 102883822 A | 1/2013 |
| CN | 102971805 A | 3/2013 |
| CN | 103380466 A | 10/2013 |
| CN | 103827790 A | 5/2014 |
| CN | 104508758 A | 4/2015 |
| JP | 2006-070300 A | 3/2006 |
| JP | 2009-505358 A | 2/2009 |
| JP | 2009-129882 A | 6/2009 |
| JP | 5289859 B2 | 2/2010 |
| JP | 2010-507199 A | 3/2010 |
| JP | 2011-119142 A | 6/2011 |
| JP | 2011-210454 A | 10/2011 |
| JP | 2012-009383 A | 1/2012 |
| JP | 2012-022844 A | 2/2012 |
| JP | 2012-526359 A | 10/2012 |
| JP | 2012-16535 A | 11/2012 |
| JP | 2013-084628 A | 5/2013 |
| JP | 2013-517603 A | 5/2013 |
| JP | 2013-518974 A | 5/2013 |
| JP | 2016-519206 A | 6/2016 |
| KR | 10-2007-0029151 | 3/2007 |
| KR | 10-2012-0030407 A | 3/2012 |
| KR | 10-2012-0086635 A | 8/2012 |
| KR | 2013-0027634 A | 3/2013 |
| KR | 2013-0102723 A | 9/2013 |
| TW | 2009-23971 A | 6/2009 |
| TW | 2009-39251 A | 9/2009 |
| TW | 2011-10144 A | 3/2011 |
| TW | 2011-37062 A | 11/2011 |
| TW | 2012-36967 A1 | 9/2012 |
| WO | 2005-005687 A1 | 1/2005 |
| WO | 2006-072959 A1 | 7/2006 |
| WO | 2008-046058 A2 | 4/2008 |
| WO | 2009-035059 A1 | 3/2009 |
| WO | 2009-086161 | 7/2009 |
| WO | 2009-156990 | 12/2009 |
| WO | 2010-036113 | 4/2010 |
| WO | 2010-109465 A1 | 9/2010 |
| WO | 2010-129604 A1 | 11/2010 |
| WO | 2011-008227 A1 | 1/2011 |
| WO | 2011-088323 A2 | 7/2011 |
| WO | 2011-097470 A2 | 8/2011 |
| WO | 2011-106730 A2 | 9/2011 |
| WO | 2012-083082 A1 | 6/2012 |
| WO | 2012-102556 A2 | 8/2012 |
| WO | 2012-168941 A1 | 12/2012 |
| WO | 2013-006349 A1 | 1/2013 |
| WO | 2013-040245 A2 | 3/2013 |
| WO | 2013-047556 A1 | 4/2013 |
| WO | 2013-056242 A1 | 4/2013 |
| WO | 2013-094926 A1 | 6/2013 |
| WO | 2013-095971 A1 | 6/2013 |
| WO | WO-2013095971 A1 * | 6/2013 |
| WO | 2013-128458 A1 | 9/2013 |
| WO | 2013-133272 A1 | 9/2013 |
| WO | 2013-133285 A1 | 9/2013 |
| WO | 2014-127909 A1 | 8/2014 |
| WO | 2014-133890 A2 | 9/2014 |
| WO | 2015-077145 A2 | 5/2015 |

OTHER PUBLICATIONS

Chang et al., "Highly foldable transparent conductive films composed of silver nanowire junctions prepared by chemical metal reduction," Nanotechnology, 25 (2014) 285601 (7 pages).

De et al., "Silver Nanowire Networks as Flexible, Transparent Conducting Films: Extremely High DC to Optical Conductivity Ratio," ACS Nano, 3(7):1767-1774 (Jun. 2009).

Fuse, Definition of Fuse in English. Oxford Dictionaries https://en.oxforddictionaries.com/definition/fuse. Retrieved Mar. 13, 2017.

Garnett et al., "Self-limited Plasmonic Welding of Silver Nanowire Junctions," Nature Materials, vol. 11, p. 241-249, Mar. 2012.

Grouchko et al., "Conductive Inks with 'built-in' mechanism that enables sintering at room temperature," ACS Nano, 5(4):3354-3359 (2011).

Hu et al., "Scalable coating properties of flexible, silver nanowire electrodes," ACS Nano, 4(5):2955-2963 (2010).

Lam et al., "Self-diffusion in silver at low temperatures," Physica Status Solidi B, 57 (1973), p. 225-236.

Liu et al., "Silver Nanowire-Based Transparent, Flexible and Conductive Thin Film," Nanoscale Research Letters, vol. 6(75), Jan. 2011, 8 pages.

Luo et al., "Size effect on thermodynamic properties of silver nanoparticles," Journal of Physical Chemistry C, 112(2008), pp. 2359-2369.

(56) References Cited

OTHER PUBLICATIONS

Magdassi et al., "Triggering the Sintering of Silver Nanoparticles at Room Temperature," ACS Nano, 4(4):1943-1948 (2010).
Nanda, et al., "Higher surface free energy of free nanoparticles," Physical Review Letters, 91(10):106102-1 (2003).
Pothoven, "Laser Patterning of Silver Nanowires," Information Display Magazine, Sep. 2012, 28(9), (10 pages).
Raaen, "Diffusion in silver fluoride," Physical Review B, 21(10):4895-4897 (1980).
Redmond et al., "Electrochemical Ostwald ripening of colloidal Ag particles on conductive substrates," Nano Letters, 5(1):131-135 (2005).
Safaei et al., "Modeling the Melting Temperature of Nanoparticles by an Analytical Approach," Journal of Physical Chemistry C, 112 (2008), pp. 99-105.
Spechler et al., "Direct Write Pulsed Laser Processed Silver Nanowire Networks for Transparent Conducting Electrodes," Springer-Verlag, vol. 108, pp. 25-28, May 10, 2012.
Sun et al., "AgCl nanoparticle nanowires fabricated by template method," Materials Letters, 61 (2007), pp. 1645-1648.
Tokuno et al., "Fabrication of Silver Nanowire Transparent Electrodes at Room Temperature," Nano Research, (2011), 4(12): 1215-1222.
Van Heyningen, R., "Electron Drift Mobility in Silver Chloride," Physical Review, (Dec. 1, 1962), pp. 2112-2118.
Yan et al., "Recent Research Progress on Preparation of Silver Nanowires by Soft Solution Method," Reviews on Advanced Materials Science 24, (2010), pp. 10-15.
Zhu et al., "Transferable Sefl-welding Silver Nanowire Network as High Performance Transparent Flexible Electrode," Nanotechnology 24, (Jul. 26, 2013), 24(335202): 1-7.
Allen, "Photoinitiators for UV and visible curing of coatings: mechanisms and properties", Journal of Photochemistry and Photobiology A Chemistry, vol. 100, (1996) p. 101-107.
Bermocoll® E 230 FQ Product Information, Akzo Nobel Chemicals AG, Performance Additives, www.akzonobel.com/pa.
Cambrios Archived Website, ClearOhm, "High Performance Transparent Conductive Material", Cambrios Technologies Corporation, Nov. 2010.
Chen et al., "Polysaccharide Hydrogenls for Protein Drug Delivery", Carbohydrate Polymers, 28, (1995), p. 69-76.
Coskun et al., "Optimization of silver nanowire networks for polymer light emitting diode electrodes", Nanotechnology, 24, 125202, (2013) p. 1-9.
Ducamp-Sanguesa et al. "Synthesis and Characterization of Fine and Monodisperse Silver Particles of Uniform Shape", Journal of Solid State Chemistry, vol. 100 pp. 272-280 (1992).
Gu, Shouwu, "The Creation of Nanojunctions", The Royal Society of Chemistry, Nanoscale, (2010), 2, pp. 2521-2529.
Hu et al., "Metal nanogrids, nanowires, and nanofibers for transparent electrodes", MRS Bulletin, vol. 36, p. 1-7, Oct. 2011.
Imam et al., "Biobased adhesives, gums, emulsions, and binders: current trends and future prospects", Journal of Adhesion Science and Technology, vol. 27, Nos. 18-19, 1972-1997, (2013).

Kang et al., "Halide Welding for Silver Nanowire Network Electrode," ACS Applied Materials & Interfaces 2017, 9, 30779-30785, Apr. 18, 2017.
Kang et al., "Epitaxial-Growth-Induced Junction Welding of Silver Nanowire Network Electrodes" CS Nano 2018, 12, 4894-4902, Apr. 2018.
Khanarian et al., "The Optical and Electrical Properties of Silver Nanowire Mesh Films", Journal of Applied Physics, 114(024302), doi: 10.1063/1.4812390, (2013).
Kim et al., "Large Discrete Resistance Jump at Grain Boundary in Copper Nanowire", American Chemical Society Nano Letters 2010, 10, 3096-3100, Jul. 7, 2010.
Kumar et al., "Silver nanowire based flexible electrodes with improved properties: High conductivity, transparency, adhesion and low haze", Material Research Bulletin, vol. 48, (2013), p. 2944-2949.
Kunjappu, "Ink Chemistry", www.chemistryworld.com/news/ink-chemistry/3002158.article, p. 1-18, Feb. 20, 2019.
Lu et al., "Cold Welding of Ultrathin Gold Nanowires", Nature Nanotechnology, vol. 5, p. 1-7, Mar. 2010.
Ma et al., "Synthesis of small silver nanocubes in a hydrophobic solvent by introducing oxidative etching with Fe(III) species†", Journal of Materials Chemistry 2010, 20, 3586-3589, Apr. 9, 2010.
Madaria et al., "Uniform, Highly Conductive, and Patterned Transparent Films of a Percolating Silver Nanowire Network on Rigid and Flexible Substrates Using a Dry Transfer Technique", NanoRes, (2010) 3: 564-573.
Martin et al., "Hydrophilic Matrix Tablets for Oral Controlled Release", AAPS Advances in the Pharmaceutical Sciences Series 16, DOI 10.1007/978-1-4939-1519-4_5. (2014).
Poole, C.F., "Pyrolysis Gas Chromatography", Gas Chromatography, Chapter 11, Elsevier Inc., (2012).
Sun et al., "Crystalline Silver Nanowires by Soft Solution Processing", ACS Nano Letters 2002, vol. 2 No. 2, 165-168, Jan. 3, 2002.
Wang et al., "Water-Soluble Ethylhydroxyethyl Cellulose Prevents Bacterial Translocation Induced by Major Liver Resection in the Rat", Annals of Surgery, vol. 217 No. 2, p. 155-167, (1993).
Wiley et al., "Polyol Synthesis of Silver Nanostructures: Control of Product Morphology with Fe(II) or Fe(III) Species", ACS Journal of Surfaces and Colloids, vol. 21 No. 18, 8077-8080, Aug. 30, 2005.
Chinese office action from corresponding Chinese Application No. 201580041760.X dated Jan. 3, 2019.
Japanese office action from corresponding Japanese Application No. 2017-505219 dated Apr. 9, 2019.
Korean office action from corresponding Korean Application No. 10-2017-7005587 based on PCT/US2015/042203 dated May 17, 2019.
Petiton for Inter Partes Review of U.S. Pat. No. 9,183,968, Case IPR2019-00655 dated Feb. 1, 2019.
Patent Owner's Preliminary Response for Inter Partes review of U.S. Pat. No. 9,183,968, Case IPR2019-00655 dated May 13, 2019.
Preliminary Rejection from Korean Patent Application No. 10-2019-7036371 dated Mar. 30, 2020.
Huang et al., "Self-Limited Nanosoldering of Silver Nanowires for High-Performance Flexible Transparent Heaters", ACS Applied Materials & Interfaces, 11, 21850-21858, (2019).

* cited by examiner

TRANSPARENT CONDUCTIVE FILMS WITH FUSED NETWORKS

CROSS REFERENCE TO RELATED APPLICATIONS

This application is continuation of copending U.S. patent application Ser. No. 15/247,533 filed on Aug. 25, 2016 to Li et al., now U.S. Pat. No. 10,100,213, entitled "Metal Nanowire Inks for the Formation of Transparent Conductive Films with Fused Networks," which is a continuation of U.S. patent application Ser. No. 14/848,697 filed on Sep. 9, 2015 to Li et al. now U.S. Pat. No. 9,447,301, entitled "Metal Nanowire Inks for the Formation of Transparent Conductive Films with Fused Networks", which is a continuation of U.S. patent application Ser. No. 14/464,332 filed on Aug. 20, 2014 to Li et al., now U.S. Pat. No. 9,150,746, entitled "Metal Nanowire Inks for the Formation of Transparent Conductive Films With Fused Networks," which is a continuation of U.S. patent application Ser. No. 14/448,504 filed on Jul. 31, 2014 to Li et al., now U.S. Pat. No. 9,183,968, entitled "Metal Nanowire Inks for the Formation of Transparent Conductive Films With Fused Networks," incorporated herein by reference.

FIELD OF THE INVENTION

The invention relates to inks comprising metal nanowires suitable for forming transparent conductive films, especially films forming fused nanostructured metal networks. The invention further relates to structures formed with the inks and processes to make and use the inks.

BACKGROUND OF THE INVENTION

Functional films can provide important functions in a range of contexts. For example, electrically conductive films can be important for the dissipation of static electricity when static can be undesirable or dangerous. Optical films can be used to provide various functions, such as polarization, anti-reflection, phase shifting, brightness enhancement or other functions. High quality displays can comprise one or more optical coatings.

Transparent conductors can be used for several optoelectronic applications including, for example, touch-screens, liquid crystal displays (LCD), flat panel display, organic light emitting diode (OLED), solar cells and smart windows. Historically, indium tin oxide (ITO) has been the material of choice due to its relatively high transparency at high conductivities. There are however several shortcomings with ITO. For example, ITO is a brittle ceramic which needs to be deposited using sputtering, a fabrication process that involves high temperatures and vacuum and therefore is relatively slow and not cost effective. Additionally, ITO is known to crack easily on flexible substrates.

SUMMARY OF THE INVENTION

In a first aspect, the invention pertains to a metal nanowire ink comprising from about 0.001 wt % to about 4 wt % metal nanowires, from about 0.05 wt % to about 5 wt % hydrophilic polymer binder, and from about 0.0001 to about 0.5 wt % metal ions.

In another aspect, the invention pertains to a metal nanowire ink comprising from about 0.001 wt % to about 4 wt % metal nanowires, from about 0.0001 to about 0.5 wt % metal ions and from about 20 wt % to about 60 wt % liquid alcohol in an aqueous solution at a pH from about 5.5 to about 7.5 pH units.

In a further aspect, the invention pertains to a transparent conductive film comprising fused metal nanostructured network and a polymeric polyol, in which the film comprises from about 40 wt % to about 600 wt % polymeric polyol relative to the metal weight.

In an additional aspect, the invention pertains to a method for forming a transparent conductive network, the method comprising depositing a fusing metal nanowire ink onto a substrate surface and drying the metal nanowire ink to form a transparent conductive film. The metal nanowire ink can comprise from about 0.001 wt % to about 4 wt % metal nanowires, from about 0.05 wt % to about 5 wt % hydrophilic polymer binder, and from about 0.0001 to about 0.5 wt % metal ions. The transparent conductive film formed after the drying step can comprise fused metal nanowires in the form of a fused metal nanostructured network, the transparent conductive film having a sheet resistance no more than about 250 ohms/sq.

In other aspects, the invention pertains to a transparent conductive film comprising a sparse metal conductive element having a sheet resistance from about 45 ohms/sq to about 250 ohms/sq and a haze no more than about 0.8%, or a sheet resistance from about 30 ohms/sq to about 45 ohms/sq and a haze from about 0.7% to about 1.2%.

Moreover, the invention can pertain to a method for sintering an as deposited metal nanowire ink with metal ions, the method comprising drying a metal nanowire film at a temperature from about 60° C. to about 99° C. at a relative humidity of at least about 40% for at least about 1 minute. In some embodiments, the metal nanowire film is formed through the deposition of a metal nanowire ink comprising from about 0.001 wt % to about 4 wt % metal nanowires, from about 0.05 wt % to about 5 wt % hydrophilic polymer binder, and from about 0.0002 to about 0.5 wt % metal ions.

DETAILED DESCRIPTION OF THE INVENTION

Figure 1:
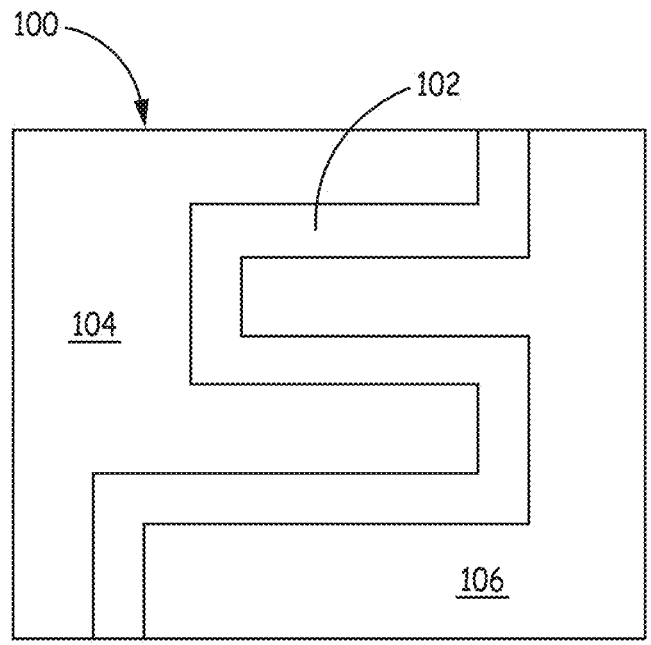
FIG. 1 is a schematic diagram showing fused metal network along the substrate surface forming a conductive pattern with a single pathway.

Stable metal nanowire inks provide for the formation of transparent conductive films with excellent optical properties and low sheet resistance in which sparse metal conductive layers generally comprise fused nanostructured metal networks with a polymer binder that are formed under controlled conditions. The inks generally comprise a dispersion of metal nanowires, metal ions as a fusing agent, and a polymer binder in an aqueous system. In some embodiments, the ink comprises an alcohol, which can lend desirable properties to the ink and/or processing into a film. In some embodiments, the stable inks have a pH toward a neutral value, as described further below, which is convenient for processing, and effective stable fusing metal nanowire inks can be formed with no added acid. The inks can be stable with respect to avoiding settling for significant periods of time to provide for convenient processing under commercially reasonable circumstances. The resulting transparent conductive films can have low sheet resistance along with good optical properties, e.g., a high optical transparency and low haze, and very low values of haze have been achieved with reasonably low values of sheet resistance. The transparent conductive films can be patterned through printing into a desired pattern and/or by etching a film to form a desired pattern. The transparent conductive films can be incorporated into a range of products such as touch sensors or photovoltaic devices.

Silver nanowire based films have entered commercial use for the formation of transparent conductive electrodes or the like. The metal in the nanowires is inherently electrically conductive, but in structures formed with the metal nanowires electrical resistance can arise from insufficient contact between wires to provide for longer distance electrical conduction. Efforts to improve electrical conductivity for metal nanowire films can be based on improving the properties of the nanowires along with improving the contact at junctions between adjacent metal nanowires. It has been discovered that fusing of adjacent metal nanowires to form a fused nanostructured metal network can be a flexible and effective approach to form transparent conductive films with desirable properties.

As noted above, sparse metal conductive layers can be effectively formed from metal nanowires. In embodiments of particular interest, a metal nanostructured network can be formed from fused metal nanowires with desirable results with respect to forming transparent conductive films. Specifically, the fused metal nanostructured networks can be formed with excellent electrical and optical qualities, which can be patterned conveniently and can be combined with a polymer binder to form an initially stabilized electrically conductive film. The metal nanostructured networks formed from fused metal nanowires provide desirable alternative to other nanowire based transparent conductive film structures.

Metal nanowires can be formed from a range of metals, and metal nanowires are available commercially. While metal nanowires are inherently electrically conducting, the vast majority of resistance in the metal nanowires based films is believed to be due to the incomplete junctions between nanowires. Depending on processing conditions and nanowire properties, the sheet resistance of a relatively transparent nanowire film, as deposited without fusing, can be very large, such as in the giga-ohm/sq range or even higher, although analogous unfused films may not necessarily be large. Various approaches have been proposed to reduce the electrical resistance of the nanowire films without destroying the optical transparency. Low temperature chemical fusing to form a metal nanostructured network has been found to be very effective at lowering the electrical resistance while maintaining the optical transparency. Using fused metal nanowire films provides for significant stabilization of the conductive films and provides extremely desirable performance especially with less critical reliance on the properties of the metal nanowires.

In particular, a significant advance with respect to achieving electrically conductive films based on metal nanowires has been the discovery of well controllable processes to form a fused metal network where adjacent sections of the metal nanowires fuse. In particular, it was discovered in previous work that halide ions can drive the fusing of metal nanowires to form fused metal nanostructures. Fusing agents comprising halide anions were introduced in various ways to successfully achieve the fusing with a corresponding dramatic drop in the electrical resistance. Specifically, the fusing of metal nanowires with halide anions has been accomplished with vapors and/or solutions of acid halides as well as with solutions of halide salts. Fusing of metal nanowires with halide sources is described further in published U.S. patent applications 2013/0341074 to Virkar et al., entitled "Metal Nanowire Networks and Transparent Conductive Material," and 2013/0342221 to Virkar et al. (the '221 application), entitled "Metal Nanostructured Networks and Transparent Conductive Material," both of which are incorporated herein by reference. The '221 application describes effective patterning based on the selective delivery of HCl vapors for forming high electrical conductivity contrast patterns that are effectively invisible to an ordinary observer under room lighting.

Metal halides formed along the surface of metal nanowires are believed to increase the mobility/diffusivity of the metal ions that result in fusing of points of contact or near contact between nanowires to form the fused network. Evidence suggests that a metal halide shell forms on the resulting fused nanowire network when the halide fusing agents are used. While not wanting to be limited by theory, it is believed that the metal halide coating on the metal nanowires results in mobilization of metal atoms/ions from the nanowires such that the mobilized ions condense to form joints between nearby nanowires forming the nanostructured network and presumably lowering the free energy when forming the fused network with a net movement of metal atoms within the nanostructure.

An extension of the process for forming fused metal nanowire networks was based on reduction/oxidation (redox) reactions that can be provided to result in fused nanowires without destroying the optical properties of the resulting film. Without wanting to be limited by theory, again the driving force would seem to be a lowering of free energy through the migration of metal to junctions to form a fused nanostructured network. Metal for deposition at the junctions can be effectively added as a dissolved metal salt or can be dissolved from the metal nanowires themselves. The effective use of redox chemistry for fusing metal nanowires into a nanostructured network is described further in U.S. patent application 2014/0238833 to Virkar et al. (the '833 application), entitled "Fused Metal Nanostructured Networks, Fusing Solutions with Reducing Agents and Methods for Forming Metal Networks," incorporated herein by reference. The '833 application also described a single solution approach for the formation of fused metal nanostructured networks, and stable inks for single solution deposition for forming fused metal nanostructured networks with excellent performance are described herein.

A further approach for the fusing of the nanowires has been described based on providing a high pH, i.e., alkaline, fusing solution to a metal nanowire film. See, copending U.S. patent application 2015/0144380 to Yang et al. (the '380 application), entitled "Transparent Conductive Coatings Based on Metal Nanowires and Polymer Binders, Solution Processing Thereof, and Patterning Approaches," incorporated herein by reference. Generally, to achieve effective fusing, the pH can be greater than about 9.5 pH units. It is believed that the alkaline conditions effectively mobilize metal ions along the surface of the metal nanowires. The metal then selectively migrates to points of contact or near contact between adjacent metal nanowires to fuse the wires. Thus, the alkaline fusing provides another alternative to the halide based fusing or the redox based fusing.

For some applications, it is desirable to pattern the electrically conductive portions of the film to introduce desired functionality, such as distinct regions of a touch sensor. Of course, patterning can be performed simply by changing the metal loading on the substrate surface either by printing metal nanowires at selected locations with other locations being effectively barren of metal or to etch or otherwise ablate metal from selected locations to remove at least some of the metal at the etched/ablated locations. Various masking, focused radiation, photolithographic techniques, combinations thereof or the like can be used to support the patterning process.

In the single solution or one ink system, dissolved metal ions can be provided as a metal source so that corresponding inks without the metal ions generally are not observed to result in fusing of the metal nanowires. For the one ink systems, it has been found that keeping the pH between about 1.5 pH units and 8 pH units or narrower ranges can be desirable to limit metal mobility in the ink and improve stability. At these pH values since moderate pH values do not significantly mobilize the metal from the wires, fusing is still observed with proper formulation of the inks based on the metal ions added to the inks. In some embodiments, suitable fusing metal nanowire inks can be formed with no added acid, although some amounts of acid can still be effectively used to form transparent conductive films. In some processing contexts, it can be desirable also to avoid low pH inks since the acid can be corrosive to some processing equipment, so the less acidic inks can also be desirable from a processing perspective. While for two ink systems summarized above with a distinct fusing solution added to an as deposited nanowire film, binder selection has been diverse while providing for good fusing and corresponding desirable film properties, for the stable one ink systems, hydrophilic polymers have been found to facilitate fusing to obtain desired low sheet resistance in the resulting films. The fusing is believed to take place during the drying process when concentrations of various constituents increased as solvent is removed. As described further below, in some embodiments improved fusing can be achieved using a more gradual drying process under humid conditions.

The desirable inks to achieve effective single deposition inks that cure into fused nanostructured metal networks comprise a desired amount of metal nanowires to achieve appropriate loading of metal in the resulting film. In appropriate solutions, the inks are stable prior to deposition of the ink and drying. The inks can comprise a reasonable amount of polymer binder that contributes to the formation of a stable conducting film for further processing. To obtain good fusing results, hydrophilic polymers have been found to be effective, such as cellulose or chitosan based polymers. Metal ions, as a source of metal for the fusing process, are supplied as a soluble metal salt.

As shown in the examples, low sheet resistance films can be formed without an alcohol solvent with appropriate other components of the inks. In particular, some suitable polymer binders can have functional groups that can reduce the metal ions to drive the fusing process. However, it can be desirable for the solvent for the inks to be an aqueous alcoholic solution. In some embodiments, the solutions can comprise from about 5 wt % to about 80 wt % of alcohol relative to the total liquid. Generally, the bulk of the remainder of the liquid is water, although some amounts of other organic solvents can be used. In additional or alternative embodiments, a blend of alcohols has been effectively used. In particular, a blend of isopropyl alcohol and ethanol has been found to yield inks with good stability and fusing properties. Stability is discussed further below, but generally a stable ink has no settling of solids after 1 hour of settling without stirring and limited visible separation after two weeks of settling without stirring.

With one ink processing, fusing metal nanowire inks with improved stability have generally been achieved without significant acidification of the inks while still providing for good fusing of metal nanowires. Also, to reduce corrosion of processing equipment, it can be desirable for the pH of the ink to be not highly acidic. In some embodiments, some mild acidification can be performed to improve solubilization of the polymer binders and/or to promote the fusing process to a further degree. Acidification to a pH below about 1.5 pH units and in some embodiments below about 3 pH units generally results in an ink with an undesirable acidity. It has been discovered that good fusing of the metal nanowires is achievable without strong acidification. Thus, the formation of inks for direct processing for fused nanostructured metal networks surprisingly can be effectively accomplished with metal ions as the metal source without any acidification or without strong acidification of the ink. However, there may be specific applications in which greater acidification can be tolerated and may provide desirable conductive films.

The use of a two solution approach with a separate fusing solution has provided for greater flexibility in forming patterns with fused and unfused regions with comparable metal loadings. As formed unfused films with a polymer binder can be formed with high sheet resistance values. The use of a single solution to form the fused metal nanostructured metal network suggests approaches for patterning based on metal loading. In particular, approaches for patterning include, for example, printing the inks to directly form the pattern with regions formed free of the ink, and/or removing portions of the deposited inks to lower their conductivity. As explained further below, removal of metal loading from regions of the substrate generally can be performed before or after drying to complete the fusing and/or can involve a portion or substantially all of the metal located at the selected region.

With one ink processing, the metal nanowires fuse to form a fused nanostructured metal network. The optical properties correspond with that of a sparse metal layer, which can manifest good optical transparency with a low haze. The resulting films can exhibit distinct properties clearly consistent with the concept that adjacent metal nanowires fuse. As an initial matter, earlier work involving a single ink fusing approach were examined with electron microscopy in which images showed the fused connections between adjacent wires. See, for example, the '221 application cited above. Similar micrographs have been obtained for the present films that show fusing of the metal nanowires into a fused network. Furthermore, control solutions without the metal ions do not exhibit the achieved very low sheet resistances observed with the fused systems. Additional evidence is found in data in which the curing/drying process is carried out in humid atmosphere. For certain silver nanowires, the fusing process seems to proceed slower, and the fusing can be performed over an extended period of time. The drying can be performed in a humid atmosphere to dry the film more slowly and provide for additional fusing of metal structure with a corresponding observed lowering of the sheet resistance. Furthermore, importantly the fused nanostructured metal networks provide a stability to the resulting transparent conductive films that allow for formation of structures incorporating the films that Applicant believes have not been achievable with traditional unfused metal nanowire films. Thus, films with fused nanostructured metal networks are potentially more suitable for applications in devices with stretchable and bendable transparent conductive films than the unfused nanowire films. Formed transparent conductive films are described in copending provisional U.S. patent application 61/978,607 to Kambe et al., entitled "Formable Transparent Conductive Films with Metal Nanowires," incorporated herein by reference.

In some embodiments of particular interest, the metal nanowire inks are stable in that no settling of solids is observed after one hour without stirring, or possibly much longer. Of course, for use, the inks may be stirred shortly before use to ensure a desired level of uniformity and performance. Nevertheless, the stability of the inks can provide desirable commercial advantages with respect to shelf life and processing approaches. Consistent with the formation of stable inks, the rheology of the inks can be adjusted over reasonable ranges to provide for commercial deposition approaches.

Various printing approaches can be used to print the inks in a pattern on a substrate. For example, lithography can be used to perform the patterning. For example, photoresists, such as commercially available compositions, can be used to block portions of the substrate with subsequent removal of the resist correspondingly removing metal loadings not associated with the exposed substrate. Alternatively, screen printing, spray coating, gravure printing or the like can be used to selectively deposit the metal nanowire inks onto portions of the substrate. Alternatively or additionally, metal loading can be partially removed after deposition onto the substrate, for example through etching or the like. Partial removal of the metal loading can comprise partial or complete removal of the metal at selected locations. Suitable etching approaches include, for example, radiation based etching and/or chemical etching. Radiation based etching can be performed with focused radiation or with masking to control exposure to the radiation. For example, a laser or a focused electron beam can be used for focused radiation etching. Masking to focus radiation can also be effectively used. With respect to chemical etching, masking can be used to control the chemical etching. For example, lithography can be used to form a pattern to direct chemical etching.

For incorporation into a product, protective layers are generally placed over the transparent conductive film and a stack structure is formed to have a structure that can then be incorporated into a product. While a range of structures can be formed to adapt to a particular product specifications, a general structure can comprise one or more layers as a substrate, the electrically conductive film with or without patterning on the substrate and one or more top coats. A thicker laminate top coat can be effectively used to protect the electrically conductive film.

Electrically conductive films formed with the single ink fusing process can achieve desirable low levels of sheet resistance, for example, no more than about 75 ohms/sq. Of course, the sheet resistance can be adjusted with various parameters, such as metal loading, and very low levels of sheet resistance may not be specified for lower cost components. Simultaneously with the low sheet resistance, the films can have very good optical transparency and low haze. Thus, the resulting structures are well suited for a range of applications for transparent conductive electrodes.

Ink Compositions and Properties

A single ink formulation provides for depositing a desired loading of metal as a film on the substrate surface and simultaneously providing constituents in the ink that induce the fusing process as the ink is dried under appropriate conditions. These inks can be referred to conveniently as fusing metal nanowire inks with the understanding that the fusing generally does not take place until drying. The inks generally comprise an aqueous solvent, which can further comprise an alcohol and/or other organic solvent in some embodiments. The inks can further comprise dissolved metal salts as a metal source for the fusing process. Without wanting to be limited by theory, it is believed that components of the ink, e.g., alcohol, reduce the metal ions from solution to drive the fusing process. Previous experience with the fusing process in these systems suggests that the metal preferentially deposits at the junctions between adjacent metal nanowires. A polymer binder can be provided to stabilize the film and to influence ink properties. The particular formulation of the ink can be adjusted to select ink properties suitable for a particular deposition approach and with specific coating properties desired. It has been found that with the one ink system to form fused metal nanostructured networks, desirable values of sheet resistance can be achieved with hydrophilic polymers, such as cellulose based polymers or chitosan based polymers. As described further below, drying conditions can be selected to effectively perform the fusing process.

Thus, for improved embodiments described herein, the fusing metal nanowire inks generally can comprise metal nanowires, an aqueous solvent, dissolved metal salts, an optional hydrophilic polymer binder, and optionally other additives. The concentration of metal nanowires influences both the fluid properties of the inks and the loading of metal deposited onto the substrate. The metal nanowire ink generally can comprise from about 0.001 to about 4 weight percent metal nanowires, in further embodiments from about 0.005 to about 2 weight percent metal nanowires and in additional embodiments from about 0.01 to about 1 weight percent metal nanowires. A person of ordinary skill in the art will recognize that additional ranges of metal nanowire concentrations within the explicit ranges above are contemplated and are within the present disclosure.

In general, the nanowires can be formed from a range of metals, such as silver, gold, indium, tin, iron, cobalt, platinum, palladium, nickel, cobalt, titanium, copper and alloys thereof, which can be desirable due to high electrical conductivity. Commercial metal nanowires are available from Sigma-Aldrich (Missouri, USA), Cangzhou Nano-Channel Material Co., Ltd. (China), Blue Nano (North Carolina, USA), EMFUTUR (Spain), Seashell Technologies (California, USA), Aiden (Korea), Nanocomposix (USA), K&B (Korea), ACS Materials (China), KeChuang Advanced Materials (China), and Nanotrons (USA). Alternatively, silver nanowires can also be synthesized using a variety of known synthesis routes or variations thereof. Silver in particular provides excellent electrical conductivity, and commercial silver nanowires are available. To have good transparency and low haze, it is desirable for the nanowires to have a range of small diameters. In particular, it is desirable for the metal nanowires to have an average diameter of no more than about 250 nm, in further embodiments no more than about 150 nm, and in other embodiments from about 10 nm to about 120 nm. With respect to average length, nanowires with a longer length are expected to provide better electrical conductivity within a network. In general, the metal nanowires can have an average length of at least a micron, in further embodiments, at least 2.5 microns and in other embodiments from about 5 microns to about 100 microns, although improved synthesis techniques developed in the future may make longer nanowires possible. An aspect ratio can be specified as the ratio of the average length divided by the average diameter, and in some embodiments, the nanowires can have an aspect ratio of at least about 25, in further embodiments from about 50 to about 10,000 and in additional embodiments from about 100 to about 2000. A person of ordinary skill in the art will recognize that additional ranges of nanowire dimensions within the explicit ranges above are contemplated and are within the present disclosure.

The solvent for the inks generally comprises an aqueous solvent that optionally also comprises an alcohol. An alcohol can provide reducing capability to drive nanowire fusing and can provide desirable ink characteristics, such as improved coating qualities. For embodiments comprising an alcohol, the solvent can comprise water and from about 5 weight percent to about 80 wt % alcohol, in further embodiments from about 10 wt % to about 70 wt %, in additional embodiments from about 15 wt % to about 65 wt % and in other embodiments from about 20 wt % to about 60 wt % alcohol. Suitable alcohol generally are soluble in or miscible with water over appropriate concentration ranges, and include, for example, short chain alcohols, such as, methanol, ethanol, isopropyl alcohol, isobutyl alcohol, tertiary butyl alcohol, other alcohols with linear or branched chains with up to 7 carbon atoms, ethylene glycol, propylene glycol, diacetone alcohol, ethyl lactate, methoxy ethanol, methoxy propanol, other glycol ethers, such as alkyl cellosolves and alkyl carbitols, or the like or blends thereof. Solvents comprising a blend of isopropyl alcohol and ethanol in an aqueous solvent are described in the examples below. In some embodiments, the solvent can optionally comprise minor amounts of other soluble organic liquids including, for example, ketones, esters, ethers, such as glycol ethers, aromatic compounds, alkanes, and the like and mixtures thereof, such as methyl ethyl ketone, glycol ethers, methyl isobutyl ketone, toluene, hexane, ethyl acetate, butyl acetate, PGMEA (2-methoxy-1-methylethylacetate), or mixtures thereof. If an optional organic solvent is present, the nanowire ink generally comprises no more than about 10 weight percent non-alcohol organic solvent, in further embodiments from about 0.5 wt % to about 8 wt % and in additional embodiments from about 1 wt % to about 6 wt % non-alcohol organic solvent. A person of ordinary skill in the art will realize that additional ranges of solvent concentrations within the explicit ranges above are contemplated and are within the present disclosure.

Metal ions provide the source of metal for fusing the metal nanowires, and the inks comprise an appropriate concentration of metal ions. The metal ions are supplied as a dissolved salt within the solvent. Generally, the metal nanowire ink comprises from about 0.0001 wt % to about 0.5 wt % metal ions, in further embodiments from about 0.00025 wt % to about 0.075 wt %, in other embodiments from about 0.0003 wt % to about 0.06 wt %, in additional embodiments from about 0.0005 wt % to about 0.05 wt % metal ions and in some embodiments from about 0.00075 wt % to about 0.025 wt %. A person of ordinary skill in the art will recognize that additional ranges within the explicit ranges of metal ion concentrations above are contemplated and are within the present disclosure. The metal salts also comprise a counter ion, which is generally believed to be inert in the film formation process, although the selection of the particular salt should provide for complete and rapid solubility in the solvent of the ink. Generally, suitable anions include, for example, nitrates, sulfates, perchlorates, acetates, fluorides, chlorides, bromides, iodides, and the like. The specific anion selection may influence somewhat the metal ion activity due to some complexation with the ion in solution, and empirical adjustment can be made based on the teachings herein. The metal ions generally correspond with the metal element of the nanowires, so with silver nanowires, silver salts are generally used to supply metal ions for fusing the nanowires. However, it is possible to use other metal ions or combinations thereof if the metal element corresponding with the metal ions corresponds with a metal element with an oxidation potential approximately comparable to or greater than, i.e., more difficult to oxidize, the metal of the nanowires. So for silver nanowire, gold ions, platinum ions, palladium ions, zinc ions, nickel ions or the like can be used in addition to or as an alternative to silver ions, and appropriate ions for other nanowires can be similarly chosen based on the teachings herein.

The pH of the fusing metal nanowire ink may or may not be adjusted with the addition of an acid. It has been found in some embodiments that stable metal nanowire inks can be formed without the addition of an acid, which results in an ink with a relatively neutral pH, e.g., from about 5.5 pH units to about 8 pH units. If no acid is added, the pH is influenced by the purity of the component solvents, dissolved $CO_2$, properties of the additives, e.g., polymer binders, and the like. It may be desirable to add acid to facilitate dissolving of a polymer binder, to influence the properties of the transparent conductive film, to influence other properties of the inks or other reasons. From a processing perspective, an ink that is not too acidic can be desirable to reduce corrosion of process equipment. Thus, in some embodiments, it is desirable to have an ink pH from about 3 pH units to about 8 pH units, in further embodiments from about 3.4 pH units to about 7.6 pH units and in additional embodiments, from about 3.8 pH units to about 7.3 pH units. In alternative embodiments, a more acidic ink can be used, but at high enough acidity generally the stability of the ink may become difficult to maintain. For more acidic stable inks, the pH generally is maintained at values of no less than about 1.5 pH units, in further embodiments no less than about 1.75 and in additional embodiments from about 2 pH units to about 3 pH units. A person of ordinary skill in the art will realize that additional ranges of pH are contemplated and are within the present disclosure. In general, any reasonable acid can be used to adjust the pH, for example strong acids, such as nitric acid, sulfuric acid, perchlorate acid, hydrochloric acid, sulfonic acid, and the like, or for higher pH values with a weak acid, such as acetic acid, citric acid, other carboxylic acids or the like. The specific acids and pH values are generally selected to avoid damage to polymer binders and other ink components.

The inks can optionally comprise a hydrophilic polymer component which is dissolved in the solvent. The inks generally comprise from about 0.01 wt % to about 5 wt % hydrophilic polymer, in additional embodiments from about 0.02 wt % to about 4 wt % and in other embodiments from about 0.05 wt % to about 2 wt % hydrophilic polymer. A person of ordinary skill in the art will recognize that additional ranges of hydrophilic polymer concentrations within the explicit ranges above are contemplated and are within the present disclosure. As used herein, the term polymer is used to refer to molecules with an average molecular weight of at least about 1000 g/mole, and polymers of particular interest in neat form are solids, although in some embodiments crosslinking can be introduced following deposition to alter the properties of the polymer. Some polymers can be difficult to evaluate with respect to molecular weight, and cellulose based polymers can be in this class. However, polymers that are difficult to evaluate with respect to molecular weight are generally understood to be at least of moderate molecular weight and would be recognized to have a molecular weight of greater than 500 g/mole even if a more specific value is difficult to attribute to the composition due to the macromolecular nature of the composition. Hydrophilic polymers generally comprise polar functional groups, such as hydroxyl groups, amide groups, amine groups, acid groups and the like, and suitable polymers with multiple hydroxyl groups, which can be referred to as polymeric polyols. Polysaccharides are a type of polymeric polyols that can have desirable properties for ink formation. Polysaccharides are sugar polymers or derivatives thereof with a large number of hydroxyl groups. Polysaccharides include, for example, cellulose based polymers and chitosan based polymers, and desirable inks based on these binders are described in the Examples below. Cellulose based polymers include cellulose esters and cellulose ethers that are formed by partial digestion of natural cellulose and reaction of a fraction of the hydroxyl groups in the cellulose. Particular cellulose based polymers include, for example, cellulose acetate, cellulose propionate, ethylcellulose, methyl cellulose, hydroxyethylcellulose, hydroxypropylmethyl cellulose, hydroxyethylmethyl cellulose, and the like. In general, commercial cellulose based polymers are not characterized by molecular weight, but these polymers can be assumed to have average molecular weights in the range of polymers as specified herein. Similarly, chitosan is a polysaccharide produced from the reaction of chitin, a natural product found in the shells of crustaceans and in fungi. Chitosan can be characterized by the degree of deacetylation of the native chitin and by the molecular weight, which generally ranges from about 3500 to about 220,000 g/mole. Chitosan is soluble in dilute aqueous acid solutions, and for example weak carboxylic acids can be used to incorporate it into the nanowire inks.

While it has been discovered that the presence of a hydrophilic polymer in the ink is significant if a binder is used in the ink, additional polymer binders can be included effectively along with the hydrophilic polymer. Suitable binders include polymers that have been developed for coating applications. Crosslinkable scratch resistant protective coatings, which can be referred to as hard coat polymers or resins, e.g. radiation curable coatings, are commercially available, for example as curable, e.g., crosslinkable, materials for a range of applications, that can be selected for dissolving in aqueous or non-aqueous solvents. Suitable classes of radiation curable polymers include, for example, polyurethanes, acrylic resins, acrylic copolymers, polyethers, polyesters, epoxy containing polymers, and mixtures thereof. As used herein, polymeric polyols are not considered hardcoat polymers. Examples of commercial polymer binders include, for example, NEOCRYL® brand acrylic resin (DMS NeoResins), JONCRYL® brand acrylic copolymers (BASF Resins), ELVACITE® brand acrylic resin (Lucite International), SANCURE® brand urethanes (Lubrizol Advanced Materials), BAYHYDROL™ brand polyurethane dispersions (Bayer Material Science), UCECOAT® brand polyurethane dispersions (Cytec Industries, Inc.), MONWITOL® brand polyvinyl butyral (Kuraray America, Inc.), polyvinyl acetates, mixtures thereof, and the like. The polymer binders can be self-crosslinking upon exposure to radiation, and/or they can be crosslinked with photoinitiator or other crosslinking agent. In some embodiments, photocrosslinkers may form radicals upon exposure to radiation, and the radicals then induce crosslinking reactions based on radical polymerization mechanisms. Suitable photoinitiators include, for example, commercially available products, such as IRGACURE® brand (BASF), GENOCURE™ brand (Rahn USA Corp.), and DOUBLECURE® brand (Double Bond Chemical Ind., Co, Ltd.), combinations thereof or the like.

If a UV curable resin binder is used along with the hydrophilic binder, e.g. polymeric polyol, the ink generally comprises from about 0.01 wt % to about 2.5 wt % curable binder, in further embodiments from about 0.025 wt % to about 2 wt % and in additional embodiments from about 0.05 wt % to about 1.5 wt % curable binder. To facilitate the crosslinking of the binder, the metal nanowire ink can comprise from about 0.0005 wt % to about 1 wt % of a crosslinking agent, e.g., a photoinitiator, in further embodiments from about 0.002 wt % to about 0.5 wt % and in additional embodiments from about 0.005 to about 0.25 wt %. A person of ordinary skill in the art will recognize that additional ranges of curable binder and crosslinking agent within the explicit ranges above are contemplated and are within the present disclosure. Applicant has found in some embodiments at least that the combination of a hydrophilic binder and a curable resin, e.g., hardcoat binder, can provide advantageous properties to the transparent conductive films. In particular, the hydrophilic polymer facilitates the fusing process in the one ink format such that desirably low sheet resistance values can be achieved while the curable resin is believed to provide protection to the film from environmental degradation following incorporation into a product.

The nanowire ink can optionally comprise a rheology modifying agent or combinations thereof. In some embodiments, the ink can comprise a wetting agent or surfactant to lower the surface tension, and a wetting agent can be useful to improve coating properties. The wetting agent generally is soluble in the solvent. In some embodiments, the nanowire ink can comprise from about 0.01 weight percent to about 1 weight percent wetting agent, in further embodiments from about 0.02 to about 0.75 weight percent and in other embodiments from about 0.03 to about 0.6 weight percent wetting agent. A thickener can be used optionally as a rheology modifying agent to stabilize the dispersion and reduce or eliminate settling. In some embodiments, the nanowire ink can comprise optionally from about 0.05 to about 5 weight percent thickener, in further embodiments from about 0.075 to about 4 weight percent and in other embodiments from about 0.1 to about 3 weight percent thickener. A person of ordinary skill in the art will recognize that additional ranges of wetting agent and thickening agent concentrations within the explicit ranges above are contemplated and are within the present disclosure.

Wetting agents can be used to improve the coatability of the metal nanowire inks as well as the quality of the metal nanowire dispersion. In particular, the wetting agents can lower the surface energy of the ink so that the ink spreads well onto a surface following coating. Wetting agents can be surfactants and/or dispersants. Surfactants are a class of materials that function to lower surface energy, and surfactants can improve solubility of materials. Surfactants generally have a hydrophilic portion of the molecule and a hydrophobic portion of the molecule that contributes to its properties. A wide range of surfactants, such as nonionic surfactants, cationic surfactant, anionic surfactants, zwitterionic surfactants, are commercially available. In some embodiments, if properties associated with surfactants are not an issue, non-surfactant wetting agents, e.g., dispersants, are also known in the art and can be effective to improve the wetting ability of the inks. Suitable commercial wetting agents include, for example, COATOSIL™ brand epoxy functionalized silane oligomers (Momentum Performance Materials), SILWET™ brand organosilicone surfactant (Momentum Performance Materials), THETAWET™ brand short chain non-ionic flurosurfactants (ICT Industries, Inc.), ZETASPERSE® brand polymeric dispersants (Air Products Inc.), SOLSPERSE® brand polymeric dispersants (Lubrizol), XOANONS WE-D545 surfactant (Anhui Xoanons Chemical Co., Ltd), EFKA™ PU 4009 polymeric dispersant (BASF), MASURF FP-815 CP, MASURF FS-910 (Mason Chemicals), NOVEC™ FC-4430 fluorinated surfactant (3M), mixtures thereof, and the like.

Thickeners can be used to improve the stability of the dispersion by reducing or eliminating settling of the solids from the metal nanowire inks. Thickeners may or may not significantly change the viscosity or other fluid properties of the ink. Suitable thickeners are commercially available and include, for example, CRAYVALLAC™ brand of modified urea such as LA-100 (Cray Valley Acrylics, USA), polyacrylamide, THIXOL™ 53 L brand acrylic thickener, COAPUR™ 2025, COAPUR™ 830 W, COAPUR™ 6050, COAPUR™ XS71 (Coatex, Inc.), BYK® brand of modified urea (BYK Additives), Acrysol DR 73, Acrysol RM-995, Acrysol RM-8W (Dow Coating Materials), Aquaflow NHS-300, Aquaflow XLS-530 hydrophobically modified polyether thickeners (Ashland Inc.), Borchi Gel L 75 N, Borchi Gel PW25 (OMG Borchers), and the like.

Additional additives can be added to the metal nanowire ink, generally each in an amount of no more than about 5 weight percent, in further embodiments no more than about 2 weight percent and in further embodiments no more than about 1 weight percent. Other additives can include, for example, anti-oxidants, UV stabilizers, defoamers or anti-foaming agents, anti-settling agents, viscosity modifying agents, or the like.

In general, the inks can be formed with any reasonable order of combining components, but in some embodiments it can be convenient to start with well dispersed metal nanowires. The metal nanowires are generally dispersed in water, alcohol, or blends thereof. Suitable mixing approaches can be used to blend the inks with the addition of components.

The well blended inks can be stable with respect to settling without continued stirring. For example, a stable ink can exhibit no visible settling after one hour without any stirring. Visible settling can be evaluated as solids on the bottom of the vessel and/or as a visible inhomogeneity from the top to the bottom of the vessel with the ink. In some embodiments, the fusing metal nanowire inks can exhibit no settling out of solids for at least a day, in further embodiments for at least three days, and in additional embodiments at least a week, although inks may not exhibit settling of solids from the dispersion for significantly longer periods. In some embodiments, the fusing metal nanowire inks can exhibit no visible inhomogeneity without stirring after at least 4 hours, in additional embodiments for at least a day and in further embodiments for at least 4 days, although inks may be stable to visible inhomogeneity for significantly longer periods of time. A person of ordinary skill in the art will recognize that additional ranges of settling stability periods within the explicit ranges above are contemplated and are within the present disclosure. Of course in a commercial setting, the inks will be stirred shortly before use to ensure very well mixed solution for deposition, and some settling should not disturb a good well mixed and well characterized ink for deposition. Nevertheless, stable inks provide improved shelf lives for storage of the completed inks before an undesirable degree of settling occurs and decrease the attention to mixing to maintain appropriate reproducible deposition of the inks during use of the inks. Thus, the fusing metal nanowire inks are well suited for commercial application to form transparent conductive films.

Processing of Inks and Structures Incorporating the Transparent Conductive Films In embodiments of particular interest, a process is used in which a sparse nanowire coating is initially formed with the fusing metal nanowire inks and subsequent processing provides for the fusing of the metal nanowires into a metal nanostructured network, which is electrically conducting. The fusing process is believed to generally take place during the drying of the film. Fused nanostructured metal films are generally formed on a selected substrate surface after drying. In general, the dried films have good optical properties, including, for example, transparency and low haze. Processing can be adapted for patterning of the film as described further below. One or more polymer overcoats can be applied over the conductive film, whether or not patterned, to provide a protective cover and the polymer can be selected to maintain optical transparency.

In general, suitable substrates can be selected as desired based on the particular application. Substrate surfaces can comprise sheets of, for example, polymers, glass, inorganic semiconductor materials, inorganic dielectric materials, polymer glass laminates, composites thereof, or the like. Suitable polymers include, for example, polyethylene terephthalate (PET), polyethylene naphthalate (PEN), polyacrylate, poly(methyl methacrylate), polyolefin, polyvinyl chloride, fluoropolymer, polyamide, polyimide, polysulfone, polysiloxane, polyetheretherketone, polynorbornene, polyester, polystyrene, polyurethane, polyvinyl alcohol, polyvinyl acetate, acrylonitrile-butadiene-styrene copolymer, polycarbonate, a copolymer thereof or blend thereof or the like. Furthermore, the material can have a polymer overcoat placed on the fused metal nanowire network, and the overcoat polymers can comprise the polymers listed for the substrates above and/or the curable resins, e.g., UV curable hardcoat polymers, described above for inclusion in the inks. Moreover, other layers can be added on top or in between the conductive film and substrate to reduce reflective losses and improve the overall transmission of the stack.

For the deposition of the fusing metal nanowire ink, any reasonable deposition approach can be used, such as dip coating, spray coating, knife edge coating, bar coating, Meyer-rod coating, slot-die, gravure printing, spin coating or the like. The ink can have properties, such as viscosity, adjusted appropriately with additives for the desired deposition approach. Similarly, the deposition approach directs the amount of liquid deposited, and the concentration of the ink can be adjusted to provide the desired loading of metal nanowires on the surface.

After forming the coating with the dispersion, the nanowire network can be dried to remove the liquid. The fusing is believed to take place during the drying of the liquid. The films can be dried, for example, with a heat gun, an oven, a thermal lamp or the like, although the films that can be air dried can be desired in some embodiments. In general, the fusing is believed to be a low temperature process, and any heat application to facilitate drying is incidental to the fusing. In some embodiments, the films can be heated to temperatures from about 50° C. to about 150° C. during drying, in further embodiments from about 60° C. to about 145° C. and in additional embodiments from about 65° C. to about 135° C. The heating to drive the drying can be performed for at least about 30 seconds, in further embodiments from about 45 seconds to about 2 hours and in other embodiments from about 1 minute to about 45 minutes. In some embodiments, improved electrical conductivity presumably associated with increased fusing within the network has been obtained with drying with an addition of humidity during the drying process. For example, the relative humidity can be set to about 15% to about 75%, in further embodiments form about 20% to about 70% and in additional embodiments from about 25% to about 65%. The corresponding temperature when drying with added humidity can be, for example, from about 50° C. to about 99° C., in further embodiments from about 60° C. to about 95° C. and in other embodiments from about 65° C. to about 90° C. The humidity naturally slows the drying time relative to equivalent systems without the humidity, although the humidity seems to improve and possibly speeds the fusing process. A person of ordinary skill in the art will recognize that additional ranges of temperature, drying times and humidity within the explicit ranges above are contemplated and are within the present disclosure. The improvement of the fusing through the drying under more humid conditions at lower temperatures is consistent with a chemically driven fusing process. After drying to induce the fusing process, the films can be washed one or more times, for example, with an alcohol or other solvent or solvent blend, such as ethanol or isopropyl alcohol, to removed excess solids to lower haze.

Following fusing of the metal nanowires into a network, the individual nanowires generally are no longer present, although the physical properties of the nanowires used to form the network can be reflected in the properties of the fused metal nanostructured network. The metal fusing is believed to contribute to the enhanced electrical conductivity observed and to the good optical properties achievable at low levels of electrical resistance. The fusing is believed to take place at points of near contact of adjacent nanowires during processing. Thus, fusing can involve end-to-end fusing, side wall to side wall fusing and end to side wall fusing. The degree of fusing may relate to the processing conditions, as noted above in the context of the humidity. Adjustment of processing conditions can be used to achieve good fusing without degradation of the fused nanowire network, such that desirable film properties can be achieved.

The amount of nanowires delivered onto the substrate can involve a balance of factors to achieve desired amounts of transparency and electrical conductivity. While thickness of the nanowire network can in principle be evaluated using scanning electron microscopy, the network can be relatively sparse to provide for optical transparency, which can complicate the measurement. In general, the fused metal nanowire network would have an average thickness of no more than about 5 microns, in further embodiments no more than about 2 microns and in other embodiments from about 10 nm to about 500 nm. However, the fused nanowire networks are generally relatively open structures with significant surface texture on a submicron scale, and only indirect methods can generally be used to estimate the thickness. The loading levels of the nanowires can provide a useful parameter of the network that can be readily evaluated, and the loading value provides an alternative parameter related to thickness. Thus, as used herein, loading levels of nanowires onto the substrate is generally presented as milligrams of nanowires for a square meter of substrate. In general, the nanowire networks can have a loading from about 0.1 milligrams (mg)/m$^2$ to about 300 mg/m$^2$, in further embodiments from about 0.5 mg/m$^2$ to about 200 mg/m$^2$, and in other embodiments from about 1 mg/m$^2$ to about 150 mg/m$^2$. A person of ordinary skill in the art will recognize that additional ranges of thickness and loading within the explicit ranges above are contemplated and are within the present disclosure.

A polymer overcoat(s) or layer(s) can be desirable to place over the metal layer, which may or may not be patterned. In general, the polymer hardcoat binders described in the previous section can be adapted for use as polymer overcoats, although additional polymers can be used. Also, with respect to processing, the polymer overcoats can be applied using solutions coating techniques, or other processing approaches such as extrusion, lamination, calendering, melt coating techniques or the like. If there is a plurality of polymer overcoats, they may or may not be applied using similar approaches. For solution processed overcoats, the various coating approaches described above, can be equally applied to these layers. However, the solution processing of a polymer overcoat can be directed to solvents that are not necessarily compatible with forming good dispersions of metal nanowires.

In general, the polymer overcoats can have average thicknesses from about 50 nanometers (nm) to about 25 microns, in further embodiments, from about 75 nm to about 15 microns and in additional embodiments from about 100 nm to about 10 microns. A person of ordinary skill in the art will recognize that additional ranges of overcoat thicknesses within the explicit ranges above are contemplated and are within the present disclosure. In some embodiments, it may be possible to select an overcoat by choice of the refractive index and thickness such that after application of the overcoat the pattern of conductive and insulating areas is less visible. Overcoats may contain conductive particles, which can have average particle diameters in the range from about 3 nm-20 microns. The particles, i.e. conductive elements, can range from 0.0001-1.0 wt % of the coating solution which generally has between about 0.1-80% by weight solids. These particles can be composed of metals or metal coatings, metal oxides, conductive organic materials, and conductive allotropes of carbon (carbon nanotubes, fullerenes, graphene, carbon fibers, carbon black or the like) and mixtures of aforementioned materials. While the overcoats should not achieve a high level of electrical conductivity, these conductive particles can allow for thicker overcoats to be deposited and still allow for electrical conductivity to trace electrodes. Furthermore, the overcoat layer can be deposited on the conductive or patterned film after the trace electrodes are deposited. This allows for a thicker overcoat to be used with corresponding stabilization advantages while still allowing for electrical conductivity to be maintained between the transparent conductive layer and the silver (or other) bus bars.

The overcoats may or may not cover the entire substrate surface. In general, the polymers can be selected for the overcoat to have good optical transparency. In some embodiments, the optical properties of the films with the polymer overcoat are not significantly different from the optical properties described above for the electrically conductive film.

Film Electrical and Optical Properties

The fused metal nanostructured networks can provide low electrical resistance while providing good optical properties. Thus, the films can be useful as transparent conductive electrodes or the like. The transparent conductive electrodes can be suitable for a range of applications such as electrodes along light receiving surfaces of solar cells. For displays and in particular for touch screens, the films can be patterned to provide electrically conductive patterns formed by the film. The substrate with the patterned film, generally has good optical properties at the respective portions of the pattern.

Electrical resistance of thin films can be expressed as a sheet resistance, which is reported in units of ohms per square ($\Omega/\square$ or ohms/sq) to distinguish the values from bulk electrical resistance values according to parameters related to the measurement process. Sheet resistance of films is generally measured using a four point probe measurement or an equivalent process. In the Examples below, film sheet resistances were measured using a four point probe, or by making a square using a quick drying silver paste to define a square. The fused metal nanowire networks can have a sheet resistance of no more than about 300 ohms/sq, in further embodiments no more than about 200 ohms/sq, in additional embodiments no more than about 100 ohms/sq and in other embodiments no more than about 60 ohms/sq. A person of ordinary skill in the art will recognize that additional ranges of sheet resistance within the explicit ranges above are contemplated and are within the present disclosure. Depending on the particular application, commercial specifications for sheet resistances for use in a device may not be necessarily directed to lower values of sheet resistance such as when additional cost may be involved, and current commercially relevant values may be for example, 270 ohm/sq, versus 150 ohms/sq, versus 100 ohms/sq, versus 50 ohms/sq, versus 40 ohms/sq, versus 30 ohms/sq or less as target values for different quality and/or size touch screens, and each of these values defines a range between the specific values as end points of the range, such as 270 ohms/sq to 150 ohms/sq, 270 ohms/sq to 100 ohms/sq, 150 ohms/sq to 100 ohms/sq and the like with particular ranges being defined. Thus, lower cost films may be suitable for certain applications in exchange for modestly higher sheet resistance values. In general, sheet resistance can be reduced by increasing the loading of nanowires, but an increased loading may not be desirable from other perspectives, and metal loading is only one factor among many for achieving low values of sheet resistance.

For applications as transparent conductive films, it is desirable for the fused metal nanowire networks to maintain good optical transparency. In principle, optical transparency is inversely related to the loading with higher loadings leading to a reduction in transparency, although processing of the network can also significantly affect the transparency. Also, polymer binders and other additives can be selected to maintain good optical transparency. The optical transparency can be evaluated relative to the transmitted light through the substrate. For example, the transparency of the conductive film described herein can be measured by using a UV-Visible spectrophotometer and measuring the total transmission through the conductive film and support substrate. Transmittance is the ratio of the transmitted light intensity (I) to the incident light intensity ($I_o$). The transmittance through the film ($T_{film}$) can be estimated by dividing the total transmittance (T) measured by the transmittance through the support substrate ($T_{sub}$). ($T=I/I_o$ and $T/T_{sub}=(I/I_o)/(I_{sub}/I_o)=I/I_{sub}=T_{film}$) Thus, the reported total transmissions can be corrected to remove the transmission through the substrate to obtain transmissions of the film alone. While it is generally desirable to have good optical transparency across the visible spectrum, for convenience, optical transmission can be reported at 550 nm wavelength of light. Alternatively or additionally, transmission can be reported as total transmittance from 400 nm to 700 nm wavelength of light, and such results are reported in the Examples below. In general, for the fused metal nanowire films, the measurements of 550 nm transmittance and total transmittance from 400 nm to 700 nm (or just "total transmittance" for convenience) are not qualitatively different. In some embodiments, the film formed by the fused network has a total transmittance (TT %) of at least 80%, in further embodiments at least about 85%, in additional embodiments, at least about 90%, in other embodiments at least about 94% and in some embodiments from about 95% to about 99%. Transparency of the films on a transparent polymer substrate can be evaluated using the standard ASTM D1003 ("Standard Test Method for Haze and Luminous Transmittance of Transparent Plastics"), incorporated herein by reference. A person or ordinary skill in the art will recognize that additional ranges of transmittance within the explicit ranges above are contemplated and are within the present disclosure. When adjusting the measured optical properties for the films in the Examples below for the substrate, the films have very good transmission and haze values, which are achieved along with the low sheet resistances observed.

The fused metal networks can also have low haze along with high transmission of visible light while having desirably low sheet resistance. Haze can be measured using a hazemeter based on ASTM D1003 referenced above, and the haze contribution of the substrate can be removed to provide haze values of the transparent conductive film. In some embodiments, the sintered network film can have a haze value of no more than about 1.2%, in further embodiments no more than about 1.1%, in additional embodiments no more than about 1.0% and in other embodiments from about 0.9% to about 0.2%. As described in the Examples, with appropriately selected silver nanowires very low values of haze and sheet resistance have been simultaneously achieved. The loading can be adjusted to balance the sheet resistance and the haze values with very low haze values possible with still good sheet resistance values. Specifically, haze values of no more than 0.8%, and in further embodiments from about 0.4% to about 0.7%, can be achieved with values of sheet resistance of at least about 45 ohms/sq. Also, haze values of 0.7% to about 1.2%, and in some embodiments from about 0.75% to about 1.05%, can be achieved with sheet resistance values of from about 30 ohms/sq to about 45 ohms/sq. All of these films maintained good optical transparency. A person of ordinary skill in the art will recognize that additional ranges of haze within the explicit ranges above are contemplated and are within the present disclosure.

Patterning

Some devices involve a patterned transparent conductive electrode, and the transparent conductive films described herein can be correspondingly patterned. A particular pattern of fused conductive metal nanostructured network along the substrate surface generally is guided by the desired product. In other words, the electrically conductive pattern generally introduces functionality, such as domains for a touch screen or the like. Of course, for some product, the entire surface can be electrically conductive, and for these application pattern generally is not performed. For embodiments involving patterning, the proportion of the surface comprising the electrically conductive fused metal nanostructured network can generally be selected based on the selected design. In some embodiments, the fused network comprises from about 0.25 percent to about 99 percent of the surface, in further embodiments from about 5 percent to about 85 percent and in additional embodiment from about 10 percent to about 70 percent of the substrate surface. A person of ordinary skill in the art will recognize that additional ranges of surface coverage within the explicit ranges above are contemplated and are within the present disclosure.

Figure 2:
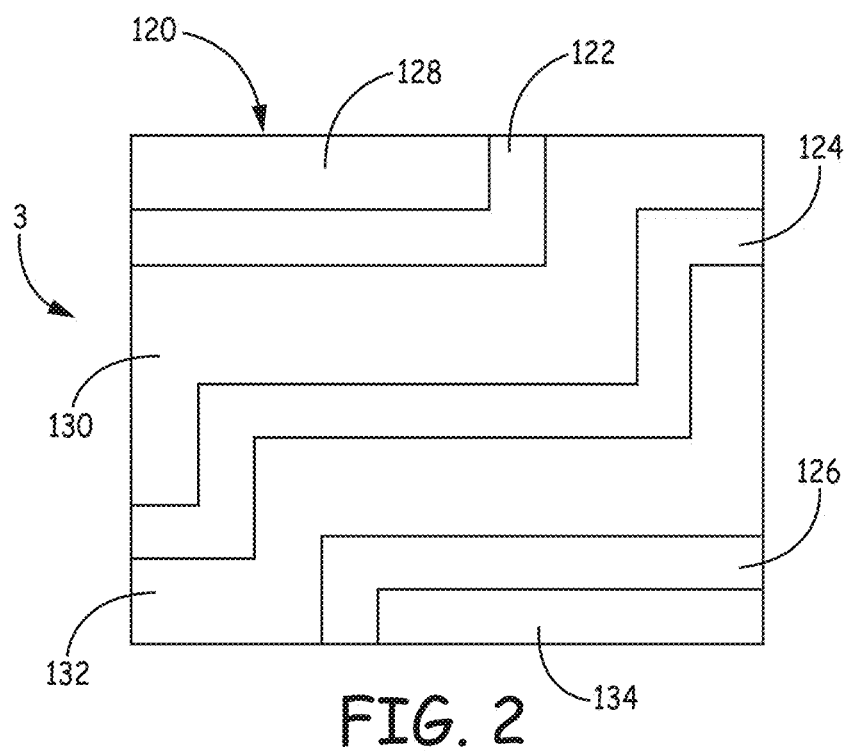
FIG. 2 is a schematic diagram showing fused metal nanostructured films along the substrate surface forming a conductive pattern with a plurality of electrically conductive pathways.
Figure 3:
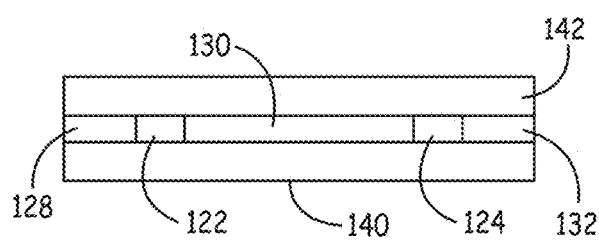
FIG. 3 is a side view of the substrate and fused films of FIG. 2 taken along arrow 3 in which a polymer overcoat is placed over the electrically conductive film.

As schematic examples, a fused metal nanostructured network can form a conductive pattern along a substrate surface 100 with a single conductive pathway 102 surrounded by electrically resistive regions 104, 106, as shown in FIG. 1 or patterns along a substrate surface 120 with a plurality of electrically conductive pathways 122, 124, and 126 surrounded by electrically resistive regions 128, 130, 132, 134, as shown in FIG. 2. As shown in FIG. 2, the fused area correspond with three distinct electrically conductive regions corresponding with electrically conductive pathways 122, 124, and 126. A side view of the structure with the patterned film of FIG. 2 is shown in FIG. 3 on a polymer substrate 140 with a polymer overcoat 142. Although a single connected conductive region and three independently connected conductive regions have been illustrated in FIGS. 1-3, it is understood that patterns with two, four or more than 4 conductive independent conductive pathways or regions can be formed as desired. For many commercial applications, fairly intricate patterns can be formed with a large number of elements. In particular, with available patterning technology adapted for the patterning of the films described herein, very fine patterns can be formed with highly resolved features. Similarly, the shapes of the particular conductive regions can be selected as desired.

Figure 5:
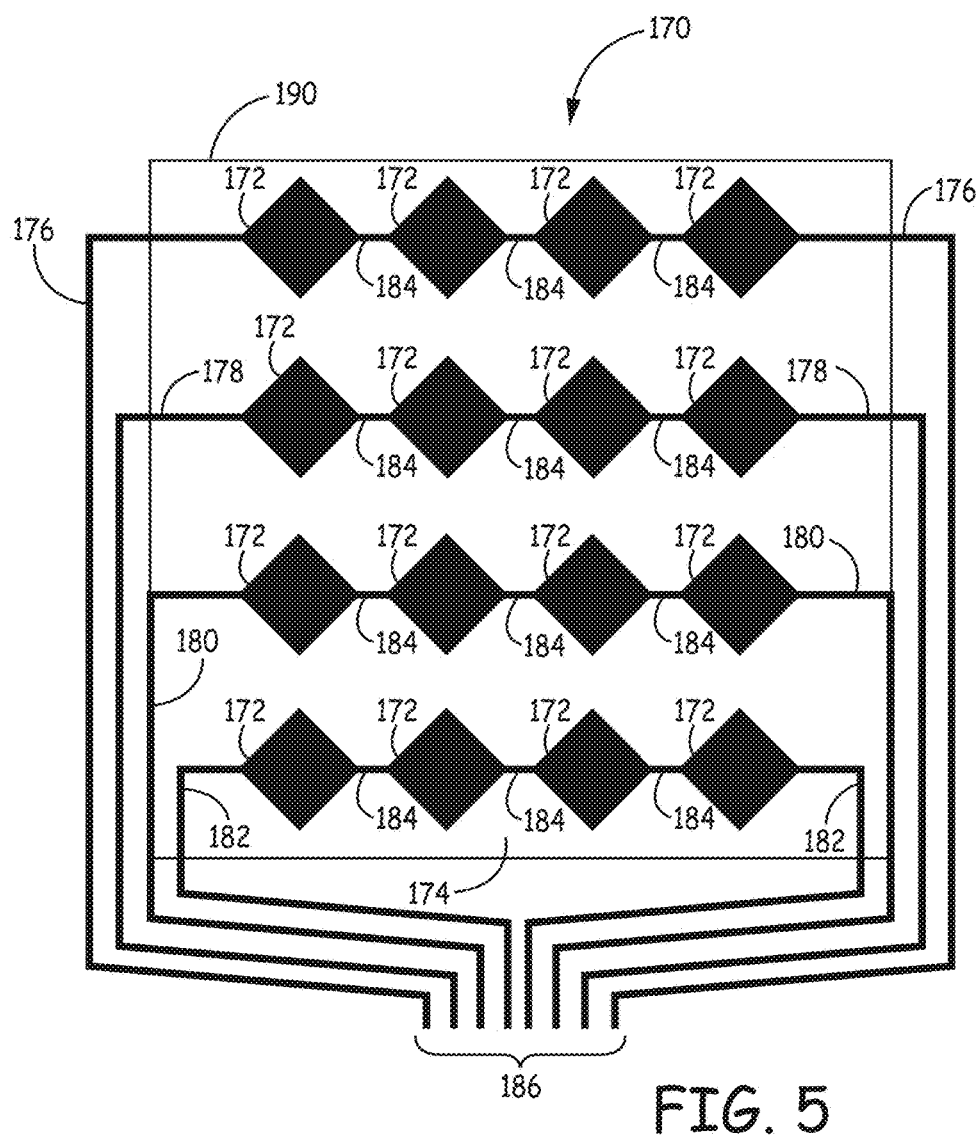
FIG. 5 is a top view of a patterned film with metal traces and a polymer overcoat configured for incorporation into a touch screen or other sensor device.
Figure 4:
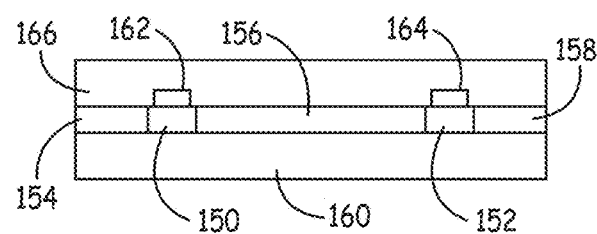
FIG. 4 is a side view of an alternative embodiment of a substrate and fused films in which electrically conductive metal leads are patterned under an overcoat.

An alternative embodiment is shown in FIG. 4 with metal electrodes placed under the overcoat in contact with the electrically conductive fused metal networks. Referring to FIG. 4, fused metal nanostructured networks 150, 152 are separated by electrically resistive regions 154, 156, 158. The films represented by networks 150, 152 are supported on substrate 160. Metal electrodes 162, 164 provide electrical connection of conductive networks 150, 152 to appropriate circuits. Polymer overcoat 166 covers and protects conductive networks 150, 152 as well as metal electrodes 162, 164. Since the metal electrodes 162, 164 are under the overcoat, a thicker overcoat can be used if desired without adversely changing performance due to electrical insulating effects of the overcoat. A schematic view of the top of a thin conductive film integrated into a sensor design is shown in FIG. 5. Sensor 170 comprises conductive metal nanostructured film sections 172, which are displayed as turned squares, separated by an insulating region 174, which may or may not comprise unfused metal nanowires. Metal traces 176, 178, 180, 182 each connect rows of conductive films 172. Metal traces 176, 178, 180, 182 comprise connective segments 184 between adjacent conductive film sections 172 as well as conductive sections that are directed to a connection zone 186 at an edge of the sensor where the metal traces can be connected to an electrical circuit. A polymer overcoat 190 is placed over the conductive film.

Patterning based on metal loading can involve selective deposition of the metal nanowire inks over selected portions of the substrate surface and/or selective removal of the deposited metal nanowire or nanostructured films. Patterning during deposition is described above in the context of depositing the metal nanowire inks. If the metal nanowire ink is deposited over the substrate surface, selected regions can be developed to remove metal from the regions before or after fusing, as well as before or after curing of the polymer binder. The metal can be removed through an appropriate etching or washing or other suitable process. For example, laser ablation of metal nanowires is described in Japanese patent 5289859B to Nissha Printing Co. Ltd., entitled "Method of Manufacturing Conductive Pattern-Covered Body, and Conductive Pattern Covered Body," incorporated herein by reference. An acid etching agent or other suitable wet etchant can be used. Dry etching can also be performed. The patterning of the etching/development can be performed using a resist composition or the like. A wide range of resists, such as photoresists can be used for patterning and are commercially available. Photolithography using light, e.g., UV light, or electron beams can be used to form high resolution patterns, and the patterning of the metal nanowire or nanostructured films can be accomplished by etching through windows forming the resist. Both positive tone and negative tone photoresists can be used. Common positive tone photoresists can be used, such as FujiFilm OCG825, TOK THMR-i-P5680 and the like, and negative tone photoresist Micro Resist Technology MR-N 415 and the like. Patterning using a resist can be performed using photolithography in which radiation exposure and development are performed to pattern the resist. Alternatively or additionally, a resist can be printed, such as with screen printing or gravure printing, to pattern the resist to accomplish the patterning processed described herein. Generally, for embodiments in which the electrically insulating region has less metal loading than the electrically conductive regions, the electrically insulating regions can have at least a factor of 1.5 less metal loading, in some embodiments at least a factor of 5 less metal loading, in further embodiments at least a factor of 10 lower metal loading and in other embodiments at least a factor of 20 less metal loading relative to the electrically conductive regions. In some embodiments, the electrically insulating regions can be approximately devoid of metal. A person of ordinary skill in the art will recognize that additional ranges of decreased metal loadings within the explicit ranges above are contemplated and are within the present disclosure.

In some embodiments, the metal nanostructured films can be used as a replacement for other materials, such as thin films of conductive metal oxides, such as indium tin oxide. For example, a roll of polymer with fused metal nanostructured films can be incorporated into a process scheme. A polymer overcoat can be placed down prior to patterning. Patterning, such as with laser etching or masking with wet or dry etching, can be used to form desired patterns of electrically conductive films separated by regions where at least some of the metal is removed. The polymer overcoat can be replaced or completed such as with an additional layer or layers of overcoat. Metal traces or current collectors can be placed over the overcoat or penetrating through the overcoat or portion thereof. Adding some conductive diluents to the polymer overcoat can decrease the resistance of the overcoat without short circuiting the conductive pattern.

Figure 6:
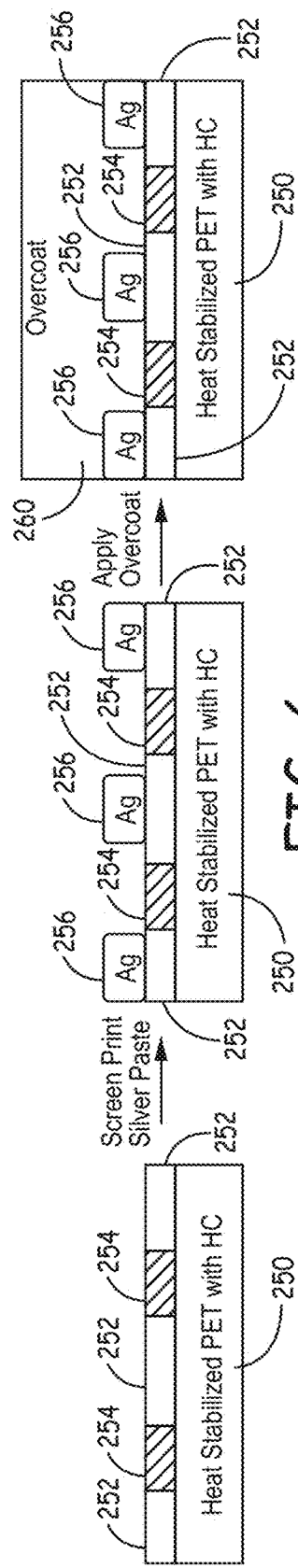
FIG. 6 is a schematic diagram showing the process flow for placement of conductive metal traces in contact with a patterned film and the deposition of a polymer overcoat over the metal traces and patterned film.

In additional or alternative embodiments, patterning can be performed prior to placement of a polymer overcoat. Referring to FIG. 6, a process flow is depicted with flow arrows indicating a process flow, which generally corresponds with a temporal flow but may or may not correspond with physical movement. In the first view, a substrate 250 is shown with a patterned film with conductive regions 252 and nonconductive regions 254. While the figure indicates a particular substrate material, i.e., heat stabilized PET polymer with an additional polymer hardcoat layer, the process can generally be performed with any reasonable substrate. In some embodiments, conductive regions 252 comprise fused metal nanostructured networks and the nonconductive regions 254 comprise a lower metal loading due to, for example, etching or selective printing of the fusing metal nanowire ink. Referring to the middle view of FIG. 6, metal current collectors or traces 256 are deposited in contact with conductive regions 252. While metal traces 256 can be deposited and/or patterned using any reasonable process, in some embodiments, a conductive silver or copper paste can be screen printed and heated to form the metal traces. In some embodiments, silver, copper or other metallic traces can be deposited by plating, thermal decomposition, evaporation, sputtering, or other reasonable thin film deposition techniques. In the last view of FIG. 6, a polymer overcoat 260 is placed over the coated substrate 250 to cover metal traces 256.

Touch Sensors

Figure 7:
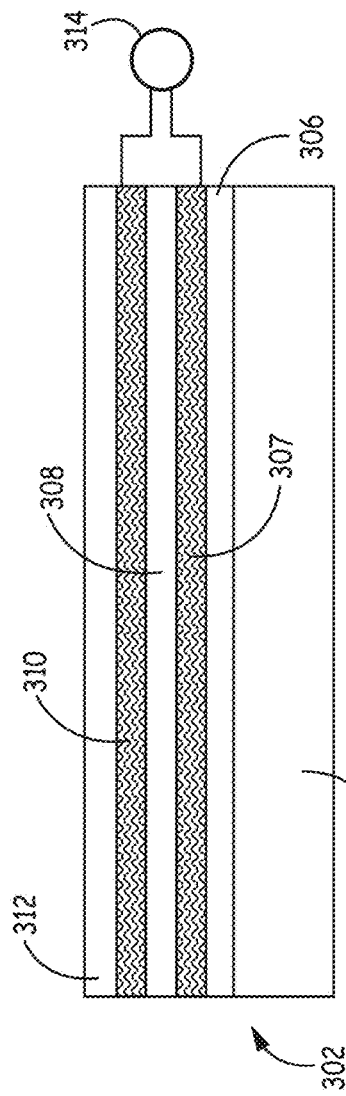
FIG. 7 is a schematic diagram showing a capacitance based touch sensor.
Figure 8:
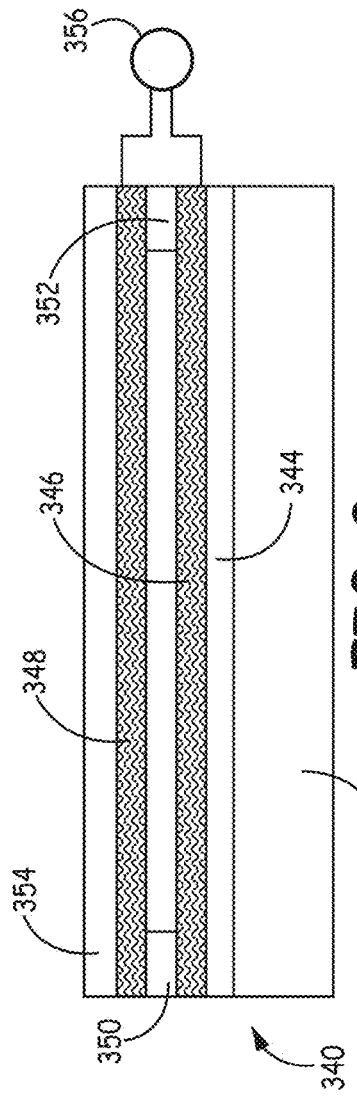
FIG. 8 is a schematic diagram showing a resistance based touch sensor.

The transparent conductive films described herein can be effectively incorporated into touch sensors that can be adapted for touch screens used for many electronic devices. Some representative embodiments are generally described here, but the transparent conductive films can be adapted for other desired designs. A common feature of the touch sensors generally is the presence of two transparent conductive electrode structures in a spaced apart configuration in a natural state, i.e., when not being touched or otherwise externally contacted. For sensors operating based on capacitance, a dielectric layer is generally between the two electrode structures. Referring to FIG. 7, a representative capacitance based touch sensor 302 comprises a display component 304, an optional bottom substrate 306, a first transparent conductive electrode structure 307, a dielectric layer 308, such as a polymer or glass sheet, a second transparent conductive electrode structure 310, optional top cover 312, and measurement circuit 314 that measures capacitance changes associated with touching of the sensor. Referring to FIG. 8, a representative resistance based touch sensor 340 comprises a display component 342, an optional lower substrate 344, a first transparent conductive electrode structure 346, a second transparent conductive electrode structure 348, support structures 350, 352 that support the spaced apart configuration of the electrode structures in their natural configuration, upper cover layer 354 and resistance measuring circuit 356.

Display components 304, 342 can be, for example, LED based displays, LCD displays or other desired display components. Substrates 306, 344 and cover layers 312, 354 can be independently transparent polymer sheets or other transparent sheets. Support structures can be formed from a dielectric material, and the sensor structures can comprise additional supports to provide a desired stable device. Measurement circuits 314, 356 are known in the art.

Transparent conductive electrodes 306, 310, 346 and 348 can be effectively formed using fused metal networks, which can be patterned appropriately to form distinct sensors, although in some embodiments the fused metal networks form some transparent electrode structures while other transparent electrode structures in the device can comprise materials such as indium tin oxide, aluminum doped zinc oxide or the like. Fused metal networks can be effectively patterned as described herein, and it can be desirable for patterned films in one or more of the electrode structures to form the sensors such that the plurality of electrodes in a transparent conductive structure can be used to provide position information related to the touching process. The use of patterned transparent conductive electrodes for the formation of patterned touch sensors is described, for example, in U.S. Pat. No. 8,031,180 to Miyamoto et al., entitled "Touch Sensor, Display With Touch Sensor, and Method for Generating Position Data," and published U.S. patent application 2012/0073947 to Sakata et al., entitled "Narrow Frame Touch Input Sheet, Manufacturing Method of Same, and Conductive Sheet Used in Narrow Frame Touch Input Sheet," both of which are incorporated herein by reference.

EXAMPLES

Commercial silver nanowires were used in the following examples with an average diameter of between 25 and 50 nm and an average length of 10-30 microns. The silver nanowires (AgNWs) films were formed using the following procedure. Commercially available silver nanowires (AgNWs) were obtained from the supplier in an aqueous dispersion or were dispersed in solvent to form an aqueous AgNW dispersion. The AgNWs dispersions were typically in the 0.05-1.0 wt % range. The dispersions were then combined with one or more solutions comprising the other components of the metal nanowire ink, which is optionally in an alcohol solvent. The resulting dispersion or ink was then deposited on the surface of a polyethylene terephthalate (PET) sheet using a hand-drawn rod approach or by blade coating. The AgNWs film was then treated with heat in an oven to cure the films as described in the specific examples below.

The hydrophilic binder when used was first dissolved in water to obtain a clear solution. It is then mixed with AgNW and other components of ink with stirring to form a homogeneous suspension, referred to as the base ink. The base ink typically contains from 0.1 wt % to 1 wt % of binder as prepared. After combining with the remaining ingredients (metal ions) in an appropriate fusing solution to obtaining the final coating solution, AgNW typically is present at a level between 0.1 to 1.0 wt % and the binder at about 0.01 to 1 wt %.

The fusing solutions are composed of appropriate metal salts dissolved in appropriate solvents. The fusing solutions generally contained between 0.05 mg/mL (0.005 wt %) and 5.0 mg/mL (0.5 wt %) metal ions The total transmission (TT) and haze of the AgNWs film samples were measured using a Haze Meter with films on a polymer substrate. To adjust the haze measurements for the samples below, a value of substrate haze can be subtracted from the measurements to get approximate haze measurements for the transparent conductive films alone. The instrument is designed to evaluate optical properties based on ASTM D 1003 standard ("Standard Test Method for Haze and Luminous Transmittance of Transparent Plastics"), incorporated herein by reference. The total transmission and haze of these films include PET substrate which has base total transmission and haze of ~92.9% and 0.15%-0.40%, respectively. Sheet resistance was measured with a 4-point probe method unless indicated otherwise. In the following examples, several different formulations of fusing metal nanowire inks are presented along with optical and sheet resistance measurements.

Sheet resistance was measured with a 4-point probe method, a contactless resistance meter or using a square of silver pastes as follows. To make measurements prior to formation, a square of silver paste was sometime used by painting the paste onto the surface of the samples to define a square, or a rectangular shape, which were then annealed at roughly 120° C. for 20 minutes in order to cure and dry the silver paste. Alligator clips were connected to the silver paste, and the leads were connected to a commercial resistance measurement device. Electrical connections are made to exposed end sections of the film.

Example 1 Fusing Nanowire Inks with Hydrophilic Binder and Nitric Acid

This example tests the ability of a cellulose based polymer (CBP) to act as a binder and thickener for AgNW inks without interfering with the fusing process.

Initial AgNWs dispersions comprised deionized water and isopropyl alcohol. The inks also contained a binder of CBP as described above. In this Example, 15 samples were prepared using the base ink. Fusing solutions or ethanol were combined with some samples each in a ratio of 3:1 AgNW ink to fusing solution or ethanol by volume. The fusing solutions contained silver nitrate as specified above and between 15 µL/mL and 80 µL/mL of $HNO_3$ in ethanol. The inks were then coated on a PET substrate using a Meyer rod or blade coating.

To dry the films, the films were heated in an oven in ambient atmosphere at 100° C. for 10 min. The properties of the films after heating are compared in Table 1. Films that were formed with an ink that included fusing solution had a reduced resistance compared to films without fusing solutions, which evidences the fusing of the metal nanowires in the relevant samples. All of the samples exhibited good optical properties based on transparency and haze.

TABLE 1

| Sample | Resistance (Ω/□) | % TT | % Haze |
|---|---|---|---|
| AgNW Ink | 461 | 91.0 | 1.76 |
| AgNW Ink | >20K | 91.6 | 1.19 |
| AgNW Ink | 2300 | 91.6 | 1.32 |
| Ag NW Ink + Fusing Solution | 65 | 91.1 | 1.43 |
| Ag NW Ink + Fusing Solution | 138 | 91.5 | 1.09 |
| Ag NW Ink + Fusing Solution | 116 | 91.6 | 1.04 |
| Ag NW Ink + Fusing Solution | 131 | 91.5 | 1.08 |
| Ag NW Ink + Fusing Solution | 122 | 91.6 | 1.05 |
| Ag NW Ink + Fusing Solution | 84 | 91.8 | 0.93 |
| Ag NW Ink + Fusing Solution | 76 | 91.6 | 1.11 |
| Ag NW Ink + Fusing Solution | 80 | 91.9 | 0.99 |
| Ag NW Ink + Fusing Solution | 80 | 91.7 | 0.99 |
| Ag NW ink + Ethanol | 693 | 91.4 | 1.33 |

Example 2 Fusing Solution Compositions

This example tests the ability of various formulations of compositions to act as a fusing solution for AgNW inks to form desirable transparent conductive films.

Initial AgNWs dispersions comprised a solvent of deionized water and a small amount of isopropyl alcohol. The base ink also contained a binder of CBP as described above. Fusing solutions or ethanol were combined with form 12 distinct samples each in a ratio of 3:1 or 4:1 AgNW ink to fusing solution or ethanol by volume, and two additional samples were processed as the base ink. The fusing solutions contain between 0.05 mg/mL and 5 mg/mL metal ions and between 15 µL/mL and 80 µL/mL of $HNO_3$ in ethanol (samples 7-10) or half of the above concentration of the ingredients (samples 11-14). The inks were then coated on a PET substrate using a Meyer rod or blade coating.

The films were then heated in an oven in ambient atmosphere at 100° C. for 10 min to dry the films. The properties of the films after heating are compared in Table 2. Films that were formed from inks that included fusing solution had a reduced resistance compared to films without fusing solutions, which indicates fusing of the nanowires in the respective films. All of the samples exhibited good optical properties, but the samples with more dilute fusing solutions exhibited slightly higher sheet resistance and greater haze.

TABLE 2

| Sample | Fusing Solution or Ethanol | Ratio (Ink:Fusing Solution or Ethanol) | Resistance (Ω/□) | % TT | Haze |
|---|---|---|---|---|---|
| 1 | — | — | 975 | 91.4 | 1.53 |
| 2 | — | — | 956 | 91.5 | 1.38 |
| 3 | Ethanol | 3:1 | 730 | 91.7 | 1.06 |
| 4 | Ethanol | 3:1 | 785 | 91.7 | 1.11 |
| 5 | Ethanol | 3:1 | 1052 | 91.7 | 1.17 |
| 6 | Ethanol | 3:1 | 3941 | 91.8 | 1.12 |
| 7 | Fusing Solution | 3:1 | 80 | 91.7 | 1.21 |
| 8 | Fusing Solution | 3:1 | 71 | 91.6 | 1.19 |
| 9 | Fusing Solution | 3:1 | 76 | 91.6 | 1.21 |
| 10 | Fusing Solution | 3:1 | 71 | 91.6 | 1.27 |
| 11 | Fusing Solution | 4:1 | 126 | 91.5 | 1.24 |
| 12 | Fusing Solution | 4:1 | 90 | 91.6 | 1.33 |
| 13 | Fusing Solution | 4:1 | 106 | 91.6 | 1.24 |
| 14 | Fusing Solution | 4:1 | 85 | 91.6 | 1.36 |

Example 3 Effect of Different AgNW Samples

This example tests the suitableness of various AgNW samples to act as an AgNW source for one ink systems.

AgNWs inks were created in deionized water using AgNW from two different commercial sources (A and B). The inks contained CBP as the binder as described above. Fusing solutions or ethanol were then combined with some samples each in a ratio of 3:1 AgNW ink to fusing solution or ethanol by volume. The fusing solutions were composed of between 0.05 mg/mL and 5.0 mg/mL metal ions with between 8 µL/mL and 80 µL/mL of $HNO_3$ in ethanol. The inks were then coated on a PET substrate using a Meyer rod or blade coating.

The films were then heated in an oven at 100° C. for 10 min to dry the films. The properties of the films after heating are compared in Table 3. Films formed with AgNWs from source A had higher sheet resistance when a fusing solution was not used and a lower sheet resistance when a fusing solution was used when compared to films made with AgNWs from source B. However, films formed from inks with AgNWs from source B had a greater transparency and a lower haze.

TABLE 3

| AgNW Source | Fusing Solution or Ethanol | Resistance (Ω/□) | % TT | % Haze |
|---|---|---|---|---|
| A | None | 1903 | 91.5 | 1.46 |
| A | None | 945 | 91.5 | 1.51 |
| A | Ethanol | 1592 | 91.8 | 1.17 |
| A | Ethanol | 1847 | 91.7 | 1.23 |
| A | Fusing Solution | 117 | 91.7 | 1.26 |
| A | Fusing Solution | 87 | 91.7 | 1.31 |
| A | Fusing Solution | 82 | 91.8 | 1.20 |
| A | Fusing Solution | 83 | 91.8 | 1.14 |
| B | None | 376 | 92.0 | 1.23 |
| B | None | 342 | 91.8 | 1.31 |
| B | Ethanol | 633 | 92.2 | 0.91 |
| B | Ethanol | 664 | 92.2 | 0.96 |
| B | Fusing Solution | 115 | 92.1 | 1.07 |
| B | Fusing Solution | 119 | 92.1 | 0.95 |
| B | Fusing Solution | 123 | 92.2 | 0.96 |
| B | Fusing Solution | 132 | 92.1 | 0.98 |

Example 4 Effect of Various Heavy Metal Ions in a One-Ink System

This example tests the effect of different heavy metal ions on the Resistance, Transmittance and Haze of resulting films in a one ink AgNW system.

Initial AgNWs dispersions comprised a solvent of isopropyl alcohol. The stock inks contained CBP as binder and also a wetting agent in water. A fusing solution was combined with the ink in a ratio of 1:1 AgNW ink to fusing solution by volume. The fusing solutions contained different metal ions in ethanol as described above. The inks were then coated on a PET substrate using a Meyer rod or blade coating.

The films were then heated in an oven at 100° C. for 10 min to dry the films. The properties of the films after heating are compared in Table 4. In general, films created with special metal ions like Ni(II) and Ag(I) in the fusing solution had lower sheet resistances relative to control sample E, while other metal ions (Co(II) and Cu(II)) did not exhibit fusing behavior.

TABLE 4

| Sample | Fusing Solution (metal ion) | Resistance (Ω/□) | % TT | % Haze |
|---|---|---|---|---|
| A | Cu(II) | 161 | 92.1 | 1.13 |
| B | Ni(II) | 63 | 92.1 | 1.11 |
| C | Co(II) | 91 | 92.2 | 1.11 |
| D | Ag(I) | 50 | 92.1 | 1.08 |
| E | EtOH | 90 | 92.0 | 1.08 |

Example 5 Ink Formulation and Stability for Inks without Acid

This example tests the effect of various formulations on the stability of the ink and the other properties in a one ink AgNW system.

Figure 9:
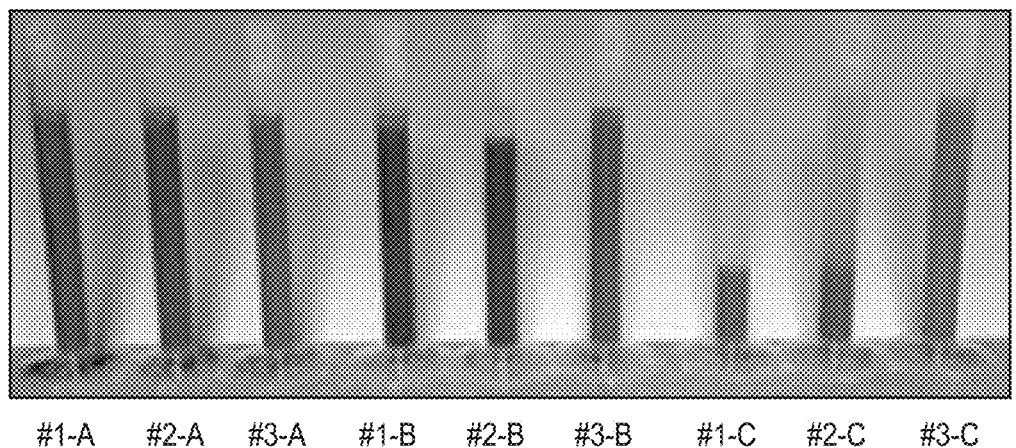
FIG. 9 is a photograph of nine different ink systems after being stored for two weeks without mixing.

Stock AgNWs inks were created in deionized water from three different commercial sources (A, B, and C) to form the base ink as described above. Results based on AgNWs from a fourth supplier D are summarized below. Three different solution compositions were formed from each of the three stock inks, resulting in 18 distinct samples. The first solution (#1) was created by mixing the stock ink with the fusing solution immediately prior to coating. The fusing solution contains between 0.05 mg/mL and 5.0 mg/mL silver ions in ethanol and was added to the #1 solution in a ratio of 1:1, stock ink to fusing solution by volume. The second solution (#2) was created by mixing the stock ink with a metal ion stock solution and storing until use. The metal ion stock solution contains between 50 mg/mL and 200 mg/mL metal ions in deionized water. The amount of metal ions in the blend of stock ink and stock metal ion solution was the same as in first solution (#1). Immediately prior to coating, ethanol was added to the #2 solution in a ratio of 1:1, solution to ethanol by volume. The third solution (#3) was formed by mixing the stock ink with fusion solution and storing until use. The fusion solution contains between 0.05 mg/mL and 5.0 mg/mL metal ions in ethanol and was added to the #3 solution in a ratio of 1:1, stock ink to fusion solution by volume. The #3 solutions were stored and then directly coated without any further mixing. The inks were coated on a PET substrate using a Meyer rod or blade coating. The stability of the inks is shown in FIG. 9. FIG. 9 depicts each of the solutions after being stored for two weeks without mixing.

The films were then heated in an oven at 100° C. for 10 min to dry the films. The properties of the films after fusing are compared in Table 5A. These results confirm that low sheet resistances indicating fusing of silver nanowires can effectively take place without any added acid in the inks. Excellent optical properties based on high % TT and low haze were also observed. The nanowires supplied by Supplier C resulted in films with somewhat greater haze. The processing order did not significant alter the results suggestive of a stable ink.

TABLE 5A

| Sample | Ink | Untreated Resistance (Ω/□) | Untreated % TT | Untreated Haze | Cured Resistance (Ω/□) | Cured % TT | Cured Haze |
|---|---|---|---|---|---|---|---|
| 1 | #1-A | >20K | 92.0 | 0.86 | 56 | 91.6 | 1.05 |
| 2 | #1-A | >20K | 91.9 | 0.88 | 57 | 91.5 | 1.06 |
| 3 | #2-A | >20K | 91.9 | 0.90 | 58 | 91.4 | 1.11 |
| 4 | #2-A | >20K | 91.9 | 0.85 | 56 | 91.4 | 1.08 |
| 5 | #3-A | 3435 | 91.9 | 0.88 | 66 | 91.5 | 1.05 |
| 6 | #3-A | 1280 | 91.9 | 0.90 | 54 | 91.5 | 1.05 |
| 7 | #1-B | 214 | 91.8 | 1.04 | 48 | 91.6 | 1.08 |
| 8 | #1-B | 192 | 91.8 | 1.02 | 48 | 91.6 | 1.05 |
| 9 | #2-B | 2985 | 91.7 | 0.93 | 49 | 91.7 | 0.99 |
| 10 | #2-B | 443 | 91.8 | 0.96 | 52 | 91.7 | 1.02 |

TABLE 5A-continued

| Sample | Ink | Untreated Resistance (Ω/□) | Untreated % TT | Untreated Haze | Cured Resistance (Ω/□) | Cured % TT | Cured Haze |
|---|---|---|---|---|---|---|---|
| 11 | #3-B | 335 | 91.8 | 0.98 | 52 | 91.7 | 0.99 |
| 12 | #3-B | 176 | 91.8 | 0.99 | 50 | 91.7 | 1.01 |
| 13 | #1-C | 396 | 91.8 | 1.19 | 70 | 91.6 | 1.28 |
| 14 | #1-C | 531 | 91.7 | 1.23 | 67 | 91.6 | 1.30 |
| 15 | #2-C | 796 | 91.7 | 1.27 | 56 | 91.5 | 1.33 |
| 16 | #2-C | 5331 | 91.7 | 1.27 | 57 | 91.6 | 1.37 |
| 17 | #3-C | 717 | 91.7 | 1.21 | 58 | 91.5 | 1.42 |
| 18 | #3-C | 1126 | 91.7 | 1.27 | 57 | 91.5 | 1.38 |

For AgNWs from the fourth supplier D, The solution was created by mixing the stock ink with the fusing solution immediately prior to coating. The fusing solution contains between 0.05 mg/mL and 5.0 mg/mL metal ions in ethanol and was added to the solution in a ratio of 1:1, stock ink to fusing solution by volume. Three different solutions were prepared with mixing increasing metal ion concentrations C1<C2<C3. Films were then formed from these solutions as described above shortly after mixing the fusing solution with the nanowire stock solutions. The results are presented in Table 5B below. The transparent conductive films formed with these nanowires had extremely low values of haze for a particular value of sheet resistance. Correspondingly, at comparable values of sheet resistance as sample formed with nanowires A or B in Table 5A, values of haze are generally lower by 0.2% or more.

TABLE 5B

| Sample | Ink | Untreated Resistance (Ω/□) | Untreated % TT | Untreated Haze | Cured Resistance (Ω/□) | Cured % TT | Cured Haze |
|---|---|---|---|---|---|---|---|
| 1 | C1-1 | 368 | 92.1 | 0.80 | 55 | 91.9 | 0.83 |
| 2 | C1-2 | 284 | 92.2 | 0.80 | 57 | 92.0 | 0.82 |
| 3 | C2-1 | 1116 | 92.1 | 0.73 | 59 | 91.6 | 0.80 |
| 4 | C2-2 | 438 | 92.2 | 0.72 | 63 | 91.7 | 0.81 |
| 5 | C3-1 | 473 | 92.2 | 0.71 | 61 | 91.6 | 0.80 |
| 6 | C3-2 | 324 | 92.2 | 0.73 | 57 | 91.6 | 0.82 |

TABLE 6

| Binder | Fusing Solution or Ethanol | Resistance (Ω/□) | TT % | % Haze |
|---|---|---|---|---|
| Chitosan 1 | Fusing Solution | 57.7 | 91.6 | 1.01 |
| Chitosan 1 | Fusing Solution | 50.0 | 91.5 | 1.08 |
| Chitosan 2 | Fusing Solution | 54.0 | 91.6 | 1.00 |
| Chitosan 2 | Fusing Solution | 50.3 | 91.6 | 1.03 |
| Chitosan 3 | Fusing Solution | 56.3 | 91.6 | 1.01 |
| Chitosan 3 | Fusing Solution | 53.0 | 91.6 | 1.03 |
| Chitosan 4 | Fusing Solution | 64.0 | 91.7 | 0.96 |
| Chitosan 4 | Fusing Solution | 58.3 | 91.6 | 0.98 |
| Chitosan 5 | Fusing Solution | 55.0 | 91.5 | 1.04 |
| Chitosan 5 | Fusing Solution | 58.3 | 91.6 | 1.01 |
| Chitosan 6 | Fusing Solution | 51.7 | 91.6 | 1.02 |
| Chitosan 6 | Fusing Solution | 51.0 | 91.6 | 1.03 |
| Chitosan 6 | Ethanol | 916 | 90.9 | 1.25 |

Example 6 the Effect of Chitosan Binders in One Ink Formulations

This example tests the effect of chitosan binders on the resistance, transmittance, and haze in a one ink AgNW system.

Initial AgNWs dispersions comprised a solvent of deionized water and a small amount of isopropyl alcohol. The stock AgNW inks contained between 0.1 wt % and 0.3 wt % silver nanowires, between 0.01 wt % and 0.1 wt % LUVITEC® (commercially available from BASF) as a codispersant, between 0.3 wt % and 0.5 wt % chitosans of different grades as binder, and between 0.05 wt % and 0.1 wt % of a wetting agent. The inks were mixed with a fusing solution between 0.5 mg/mL and 5 mg/mL metal ions in ethanol or with ethanol solvent in a ratio of 1:1 ink to fusing solution or ethanol by volume. The inks were then coated on a PET substrate using a Meyer rod or blade coating.

The films were then heated in an oven at 100° C. for 10 min to dry the films. The properties of the films after fusing are compared in Table 6. All of the films made with inks containing fusing solution exhibited excellent properties.

Example 7 the Effect of a Blend of Polyvinylpyrrolidone and CBP as a Binder

This example tests the effect of polyvinylpyrrolidone as a binder on the resistance, transmittance, and haze in a one ink AgNW system.

AgNWs inks were created in deionized water from two difference commercial sources (A and B. The stock AgNW inks contains between 0.1 wt % and 0.3 wt % silver nanowires, between 0.3 wt % and 0.75 wt % CBP as binder, between 0.01 wt % and 0.1 wt % polyvinylpyrrolidone (PVP) as a dispersant/binder, and between 0.05 wt % and 0.1 wt % of a wetting agent. The inks were mixed with a fusing solution containing between 0.5 mg/mL and 5 mg/mL metal ions in ethanol in a ratio of 1:1 by volume. The inks were then coated on a PET substrate using a Meyer rod or blade coating.

The films were then heated in an oven at 100° C. for 10 min to dry the films. The properties of the films after fusing are compared in Table 7.

TABLE 7

| Ink Source | PVP Source | Resistance ($\Omega/\square$) | TT % | % Haze |
|---|---|---|---|---|
| A | PVP 55K | 48.3 | 91.2 | 1.56 |
| A | PVP 55K | 44.3 | 91.1 | 1.62 |
| A | PVP 360K | 46.0 | 91.2 | 1.57 |
| A | PVP 360K | 46.0 | 91.1 | 1.59 |
| A | PVP 40K | 44.0 | 91.1 | 1.64 |
| A | PVP 40K | 43.0 | 91.2 | 1.63 |
| A | PVP 10K | 46.0 | 91.2 | 1.59 |
| A | PVP 10K | 45.7 | 91.2 | 1.66 |
| B | PVP 55K | 70.3 | 92.0 | 1.13 |
| B | PVP 55K | 55.7 | 92.0 | 1.15 |
| B | PVP 360K | 59.0 | 92.0 | 1.11 |
| B | PVP 360K | 59.7 | 92.0 | 1.14 |
| B | PVP 40K | 75.3 | 91.6 | 1.06 |
| B | PVP 40K | 68.0 | 91.6 | 1.10 |
| B | PVP 10K | 73.7 | 91.5 | 1.10 |
| B | PVP 10K | 64.3 | 91.6 | 1.12 |

Example 8 Effect of Moisture on Film Performance

This example tests the effect of moisture during the drying process on film performance.

The stock AgNW ink contains between 0.1 wt % and 0.30 wt % silver nanowires in isopropanol from source A. The inks were mixed with a fusing solution containing between 0.5 mg/mL and 5 mg/mL metal ions in ethanol in a ratio of 1:1 by volume. Immediately prior to coating one additional ink was mixed with ethanol in a ratio of 1:1, ink to ethanol. The inks were then coated on a PET substrate using a Meyer rod or blade coating.

Figure 10:
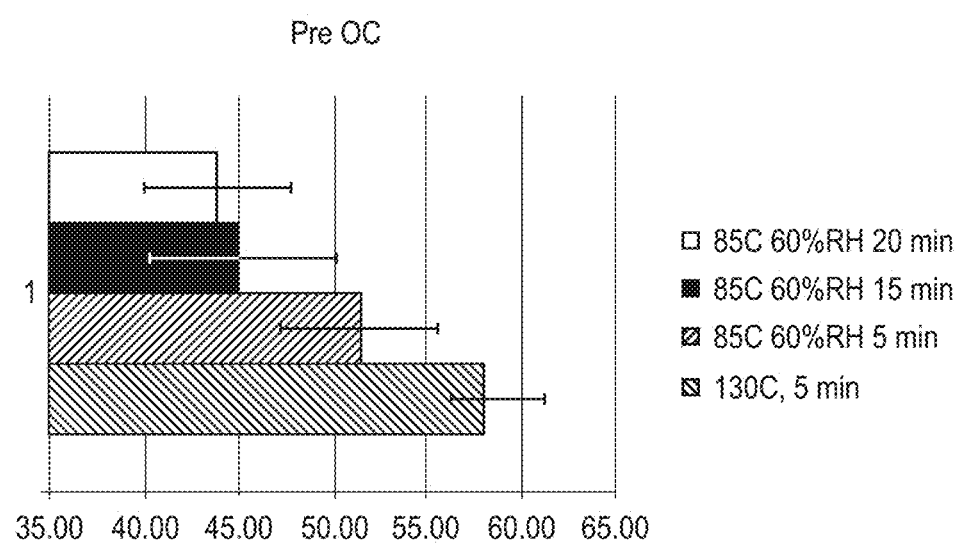
FIG. 10 is a graph of the sheet resistance of four samples dried under different conditions prior to the application of an overcoat.

The films were then heated in an oven at 85° C. with a relative humidity of 60% for 20, 15, or 5 minutes, or at 130° C. in a dry oven for 5 minutes to dry the films. The sheet resistance of the films after drying under different conditions is compared in FIG. 10. The introduction of humidity allows for a reduction of both time and temperature to achieve the same level of fusing (reduction in sheet resistance) for at least some of the samples. The drying in the humid atmosphere provided for improved fusing for these inks as indicated by a reduction of sheet resistance.

Example 9 Robustness of Film by Adding UV Curable Polymer to the Ink

This example tests the effect of UV curable polymer on the robustness of the AgNW film.

A base AgNW ink is created by mixing a AgNW ink with a AgNW concentration of between 0.1 wt % and 0.3 wt % in isopropanol with between 2 wt % and 7.5 wt % of a UV curable polymer in propylene glycol methyl ether (PGME) in a 4:1 ink to UV curable polymer ratio by volume. The inks were mixed with a fusing solution containing a concentration C1 between 0.05 mg/mL and 0.5 mg/mL silver ions or C2=10×C1 in ethanol in a ratio of 1:1 by volume. The inks were then coated on a PET substrate using a Meyer rod coating at a setting of 10 or 20.

The films were then cured using a UV conveyer. The properties of the films are compared in Table 8. The introduction of UV curable resins caused high haze in the coatings, but resistance to abrasion after UV curing was obviously much improved. The films formed without the fusing solution had very high sheet resistance values. Thus, these films with the UV curable composition mixed into the fusing ink provides greater contrast in electrical resistance between the films formed with the fusing solution and the films formed without the fusing solution. The data further show that the films with the UV curable composition mixed into the fusing ink could exhibit remarkable thermal stability. The base-coatings after UV curing showed no increase in sheet resistance (R) over the original values ($R_0$) after a treatment of 30 min in a 150° C. oven (Samples 4 and 6).

TABLE 8

| Sample | Fusing Solution | Rod | Resistance ($\Omega/\square$) | % TT | Haze | R/Ro (150° C., 30 min) |
|---|---|---|---|---|---|---|
| 1 | None | 10 | >200M | 92.4 | 3.60 | — |
| 2 | None | 20 | >200M | 91.2 | 3.34 | — |
| 3 | C1 | 10 | ~3,400 | 92.1 | 2.53 | — |
| 4 | C1 | 20 | 60 | 88.7 | 4.65 | 0.87 |
| 5 | C2 | 10 | 143 | 91.2 | 2.16 | — |
| 6 | C2 | 20 | 42 | 86.5 | 4.91 | 0.9 |

Example 10 Effect of Alcohol Free Fusing Solutions

This example tests the effect of using alcohol free fusing solutions on film performance.

The stock AgNW ink contained silver nanowires in isopropanol from source A, or in water from source B. The inks contained between 0.05 wt % and 0.3 wt % AgNW. The inks were mixed with a fusing solution in water in a ratio of 1:1 ink to fusing solution containing between 0.05 mg/mL and 5.0 mg/mL metal ions by volume. Comparative samples were prepared similarly with water instead of fusing solutions. The inks were then coated on a PET substrate using a Meyer rod or blade coating.

The films were then heated in an oven at 100° C. for 10 minutes to dry the films. The properties of the films after the heating step are shown in Table 9. The use of fusing solutions free of alcohol but with metal ions leads to effective conductivity improvement in relation to the respective comparative examples, as indicated in Table 9 as "Improvement", expressed as percent of resistance reduction.

TABLE 9

| Sample | AgNW Source | Fusing Solution | Resistance ($\Omega/\square$) | Improvement | % TT | % Haze |
|---|---|---|---|---|---|---|
| 1 | A | $H_2O$ | 94 | — | 91.8 | 1.08 |
| 2 | A | 1 (in $H_2O$) | 58 | 38% | 91.7 | 1.11 |
| 3 | A | 2 (4x conc of 1 in $H_2O$) | 56 | 40% | 91.6 | 1.14 |
| 4 | B | $H_2O$ | 82 | — | 91.8 | 1.20 |
| 5 | B | 1 (in $H_2O$) | 60 | 27% | 91.7 | 1.21 |
| 6 | B | 2 (4x conc of 1 in $H_2O$) | 64 | 21% | 91.5 | 1.27 |

Example 11 Effect of Polyox as Binders on AgNW Inks

This example tests the effect of Polyox binders in one ink AgNW systems.

Initial AgNWs dispersions comprised a solvent of deionized water and a small amount of isopropyl alcohol. The AgNW inks have between 0.05 wt % and 0.25 wt % silver nanowires. The inks also contained a binder of Polyox (polyethylene oxide) in a concentration between 0.075 wt % and 0.10 wt %, a wetting agent in a concentration between 0.10 wt % and 0.15 wt %. A fusing solution was added in a ratio of 3:1 AgNW ink to fusing solution by volume. The fusing solution contained between 0.05 mg/mL and 5.0 mg/mL silver ions and between 15 μL/mL and 80 μL/mL of HNO$_3$ in ethanol. The inks were then coated on a PET substrate using a Meyer rod or blade coating.

The films were then heated in an oven at 80° C. for 10 min to dry the films. The properties of the films after heating are compared with films formed with CBP and with fusion solution or with just EtOH as control in Table 10. In general, the ink with the Polyox binder resulted in a low resistance film when fusing solution was used indicating silver nanowire fusing. With inks having the Polyox binder, the films formed without the fusing solution had a high sheet resistance.

TABLE 10

| Sample | Binder | Fusing Solution | Resistance (Ω/□) | % TT | % Haze |
|---|---|---|---|---|---|
| 1 | CBP-60SH-10k | — | 203 | 92.0 | 1.05 |
| 2 | CBP-60SH-10k | Yes | 115 | 91.9 | 1.06 |
| 3 | Polyox N16 | — | >20K | 92 | 1.30 |
| 4 | Polyox N16 | Yes | 185 | 91.9 | 1.36 |
| 5 | Polyox N60 | — | >20K | 92 | 1.19 |
| 6 | Polyox N60 | Yes | 164 | 91.9 | 1.42 |
| 7 | Polyox 310 | — | >20K | 92.2 | 0.89 |
| 8 | Polyox 310 | Yes | 1720 | 92.2 | 0.88 |

Example 12 Effect of Sodium Metal Ions in a One-Ink System

This example tests the effect of sodium metal ions on the Transmittance and Haze in a one ink AgNW system.

Initial AgNWs dispersions comprised a solvent of deionized water and a small amount of isopropyl alcohol. The inks contained CBP as the binder as described above. Fusing solutions containing between 0.05 mg/mL and 5.0 mg/mL metal ions or ethanol were then combined with some samples each in a ratio of 3:1 AgNW ink to fusing solution or ethanol by volume. The fusing solutions were composed of metal ions (Na or Ag) with HNO$_3$ in ethanol. The fusing solutions were added in two concentrations, the initial concentration of <1 wt %, or a concentration ten times (10×) the initial concentration. The inks were then coated on a PET substrate using a Meyer rod or blade coating.

The films were then heated in an oven at 100° C. for 10 min to dry the films. The properties of the films after fusing are compared in Table 11. The results suggest that the films formed with the sodium ions in the fusing solution did not exhibit fusing, while the films formed with the silver ions did undergo fusing.

TABLE 11

| | Fusing Solution | Resistance (Ω/□) | % TT | % Haze |
|---|---|---|---|---|
| 1 | Na (1x) | 107 | 92.0 | 0.98 |
| 2 | Na (10x) | 1078 | 92.3 | 1.81 |
| 3 | Ag (1x) | 55 | 91.9 | 1.01 |
| 4 | Ag (10x) | 46 | 91.6 | 1.28 |

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein.

What is claimed is:

1. A transparent conductive film comprising a substrate and a transparent conductive layer, the transparent conductive layer comprising a fused metal nanostructured network and from about 40 wt % to about 600 wt % of a polysaccharide with the weight percent evaluated relative to the metal weight, wherein the film has a sheet resistance of no more than about 100 ohms/sq and a % TT of at least about 89%.

2. The transparent conductive film of claim 1 wherein the fused metal nanostructured network has a metal loading from about 0.1 mg/m$^2$ to about 300 mg/m$^2$.

3. The transparent conductive film of claim 1 wherein the fused metal nanostructured network has a metal loading from about 1 mg/m$^2$ to about 150 mg/m$^2$.

4. The transparent conductive film of claim 1 wherein the transparent conductive layer comprises from about 50 wt % to about 450 wt % polysaccharide relative to metal weight.

5. The transparent conductive film of claim 1 wherein the polysaccharide comprises a cellulose based polymer.

6. The transparent conductive film of claim 1 wherein the polysaccharide comprises a chitosan based polymer.

7. The transparent conductive film of claim 1 having a sheet resistance of no more than about 95 ohms/sq, a % TT of at least about 90%, wherein the metal nanostructured network comprises silver.

8. The transparent conductive film of claim 7 having a % TT of at least about 92%.

9. The transparent conductive film of claim 1 having a sheet resistance of no more than about 70 ohms/sq.

10. The transparent conductive film of claim 1 wherein the substrate comprises a polymer film supporting the transparent conductive layer.

11. The transparent conductive film of claim 1 wherein the fused metal nanostructured network comprises silver and having haze of no more than about 1.0%.

12. The transparent conductive film of claim 11 wherein the fused metal nanostructured network further comprises gold or platinum.

13. The transparent conductive film of claim 1 further comprising a polymer overcoat.

14. The transparent conductive film of claim 13 wherein the polymer overcoat comprises a UV crosslinked polymer.

15. The transparent conductive film of claim 13 wherein the polymer overcoat comprises polyurethanes, acrylic resins, acrylic copolymers, polyethers, polyesters, epoxy containing polymers, or mixtures thereof.

16. The transparent conductive film of claim 13 wherein the polymer overcoat comprises a polysiloxane.

17. The transparent conductive film of claim 13 wherein the polymer overcoat has a thickness from about 50 nm to about 1 micron.

18. The transparent conductive film of claim 13 having a sheet resistance of no more than about 70 ohms/sq.

19. The transparent conductive film of claim 18 having a haze of no more than about 0.8%.

20. The transparent conductive film of claim 19 having a % TT of at least about 92%.

* * * * *